United States Patent
Jevtic

(10) Patent No.: US 6,725,114 B1
(45) Date of Patent: *Apr. 20, 2004

(54) METHOD AND APPARATUS FOR AUTOMATICALLY GENERATING SCHEDULES FOR WAFER PROCESSING WITHIN A MULTICHAMBER SEMICONDUCTOR WAFER PROCESSING TOOL

(75) Inventor: Dusan B. Jevtic, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 49 days.

This patent is subject to a terminal disclaimer.

(21) Appl. No.: 09/771,254

(22) Filed: Jan. 26, 2001

Related U.S. Application Data

(63) Continuation-in-part of application No. 08/871,746, filed on Jun. 9, 1997, now Pat. No. 6,201,999.

(51) Int. Cl.[7] .............................................. G06F 19/00
(52) U.S. Cl. .......................... 700/100; 700/99; 700/101
(58) Field of Search .......................... 700/100, 90, 121; 414/217, 222.01, 225.01, 416, 331.01; 118/719

(56) References Cited

U.S. PATENT DOCUMENTS

| | | | | |
|---|---|---|---|---|
| 5,105,362 A | * | 4/1992 | Kotani | 364/468 |
| 5,241,465 A | * | 8/1993 | Oba et al. | 364/401 |
| 5,354,413 A | * | 10/1994 | Smesny et al. | 156/627 |
| 5,444,632 A | | 8/1995 | Kline et al. | 364/468 |
| 5,580,419 A | * | 12/1996 | Berenz | 156/628.1 |
| 5,580,819 A | * | 12/1996 | Li et al. | 427/167 |
| 5,654,903 A | * | 8/1997 | Reitman et al. | 364/551.01 |
| 5,855,681 A | * | 1/1999 | Maydan et al. | 118/719 |
| 5,904,487 A | * | 5/1999 | Conboy et al. | 438/14 |
| 5,909,994 A | * | 6/1999 | Blum et al. | 414/217 |
| 6,074,443 A | | 6/2000 | Venkatesh et al. | 29/25.01 |

FOREIGN PATENT DOCUMENTS

| | | | | |
|---|---|---|---|---|
| EP | 1 058 172 | | 6/2000 | G05B/19/4093 |
| WO | 00/79355 | | 12/2000 | G05B/19/418 |

OTHER PUBLICATIONS

PCT Search Report for corresponding Application PCT/US02/01445, dated Jan. 14, 2003.

* cited by examiner

*Primary Examiner*—Leo Picard
*Assistant Examiner*—Walter R. Swindell
(74) *Attorney, Agent, or Firm*—Moser, Patterson & Sheridan, LLP.

(57) ABSTRACT

A method and apparatus for producing schedules for a wafer in a multichamber semiconductor wafer processing tool comprising the steps of providing a trace defining a series of chambers that are visited by a wafer as the wafer is processed by the tool; initializing a sequence generator with a vertex defining initial wafer positioning within the tool; generating all successor vertices to produce a series of vectors interconnecting the vertices that, when taken together produce a cycle that represents a schedule. All the possible schedules are analyzed to determine a schedule that produces the highest throughput of all the schedules.

22 Claims, 15 Drawing Sheets

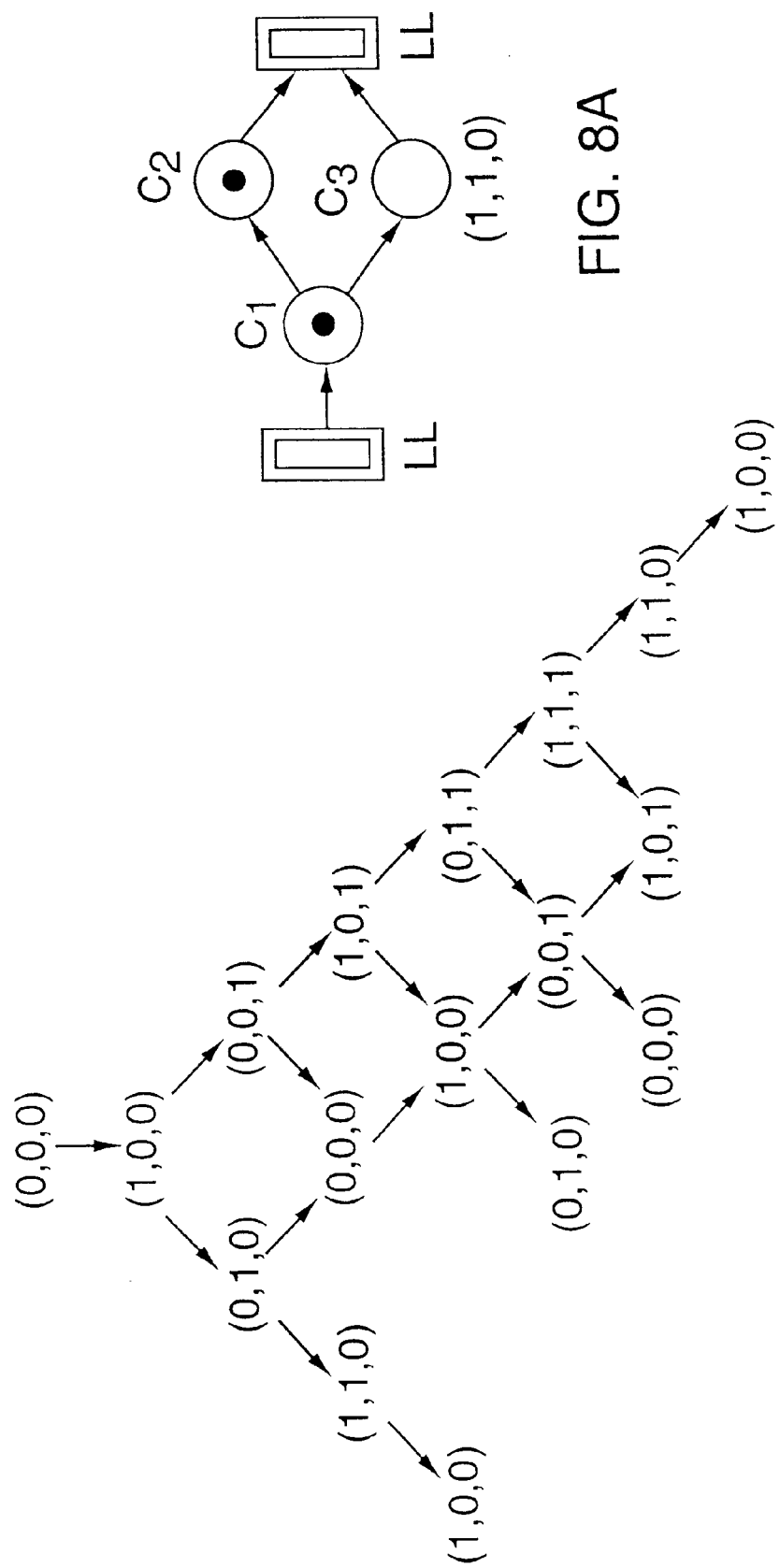

(1101)

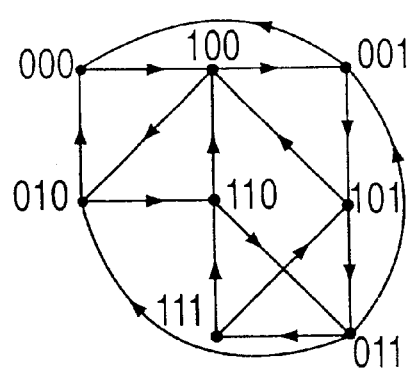 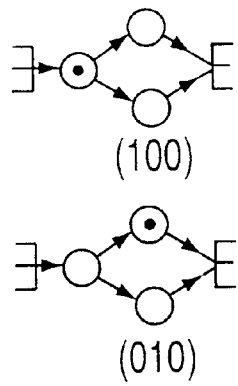
FIG. 14   FIG. 14A
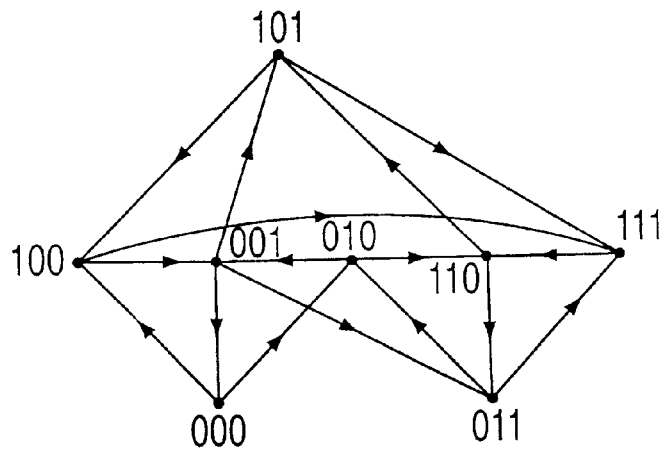 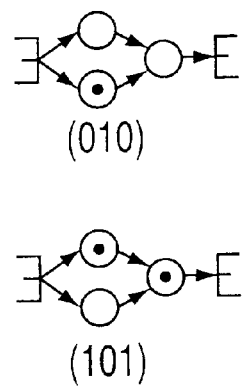
FIG. 15   FIG. 15A $$D = \begin{array}{c|cccc} & 00 & 01 & 10 & 11 \\ \hline 00 & 0 & 0 & 1 & 0 \\ 01 & 1 & 0 & 0 & 1 \\ 10 & 0 & 1 & 0 & 0 \\ 11 & 0 & 0 & 1 & 0 \end{array}$$

METHOD AND APPARATUS FOR AUTOMATICALLY GENERATING SCHEDULES FOR WAFER PROCESSING WITHIN A MULTICHAMBER SEMICONDUCTOR WAFER PROCESSING TOOL

CROSS REFERENCE TO RELATED APPLICATIONS

This application is a continuation-in-part of U.S. patent application Ser. No. 08/871,746, filed Jun. 9, 1997 and incorporated herein by reference now U.S. Pat. No. 6,201,999.

BACKGROUND OF THE INVENTION

1. Field of the Invention

The present invention relates to a multiple chamber wafer processing tool and, more particularly, to a method and apparatus for automatically generating a schedule(s) for a semiconductor wafer within a multiple chamber semiconductor wafer processing tool.

2. Description of the Background Art

Semiconductor wafers are processed to produce integrated circuits using a plurality of sequential process steps. These steps are performed using a plurality of process chambers. An assemblage of process chambers served by a wafer transport robot is known as a multiple chamber semiconductor wafer processing tool or cluster tool. Examples of cluster tools include the Centura® HDP CVD System and the Endura® system manufactured by Applied Materials, Inc. of Santa Clara, Calif. FIG. 1 depicts, in part, a schematic diagram of the Endura® System.

The cluster tool 100 contains, for example, four process chambers 104, 106, 108, 110, a transfer chamber 112, a preclean chamber 114, a buffer chamber 116, a wafer orienter/degas chamber 118, a cooldown chamber 102, and a pair of loadlock chambers 120 and 122. Each chamber represents a different stage or phase of semiconductor wafer processing. The buffer chamber 116 is centrally located with respect to the loadlock chambers 120 and 122, the wafer orienter/degas chamber 118, the preclean chamber 114 and the cooldown chamber 102. To effectuate wafer transfer amongst these chambers, the buffer chamber 116 contains a first robotic transfer mechanism 124. The wafers 128 are typically carried from storage to the system in a plastic transport cassette 126 that is placed within one of the loadlock chambers 120 or 122. The robotic transport mechanism 124 transports the wafers 128, one at a time, from the cassette 126 to any of the three chambers 118, 102, or 114. Typically, a given wafer is first placed in the wafer orienter/degas chamber 118, then moved to the preclean chamber 114. The cooldown chamber 102 is generally not used until after the wafer is processed within the process chambers 104, 106, 108, 110. Individual wafers are carried upon a wafer transport blade 130 that is located at the distal end of the first robotic mechanism 124. The transport operation is controlled by a sequencer 136.

The transfer chamber 112 is surrounded by and has access to the four process chambers 104, 106, 108 and 110 as well as the preclean chamber 114 and the cooldown chamber 102. To effectuate transport of a wafer amongst the chambers, the transfer chamber 112 contains a second robotic transport mechanism 132. The mechanism 132 has a wafer transport blade 134 attached to its distal end for carrying the individual wafers. In operation, the wafer transport blade 134 of the second transport mechanism 132 retrieves a wafer from the preclean chamber 114 and carries that wafer to the first stage of processing, for example, a physical vapor deposition (PVD) stage within chamber 104. Once the wafer is processed and the PVD stage deposits material upon the wafer, the wafer can then be moved to a second stage of processing and so on.

Once processing is complete within the process chambers, the transport mechanism 132 moves the wafer from the process chamber and transports the wafer to the cooldown chamber 102. The wafer is then removed from the cooldown chamber using the first transport mechanism 124 within the buffer chamber 116. Lastly, the wafer is placed in the transport cassette 126 within the loadlock chamber 122.

A cluster tool may be coupled to a factory interface comprising at least one factory interface robot, one or more metrology chambers/defect control chambers and one or more load ports, and one or more wafer orienting chambers. The factory interface is coupled to the load locks of the cluster tool.

More generally, a cluster tool contains n chambers, denoted by $C_1, C_2, \ldots, C_n$, one or more transfer chambers (robots) 112 and 116, and one or more loadlocks 120 and 122. The exact arrangement of chambers, robots and loadlocks is referred to as the "configuration" of the tool. A wafer $W_a$ to be processed is taken from a loadlock, placed successively into various chambers as each chamber performs a particular process upon the wafer.

A wafer's trace is the trajectory of a particular wafer through the cluster tool; that is, a trace is the order in which chambers are visited by a wafer (not necessarily $C_{i+1}$ after $C_i$). This should be distinguished from the term "processing sequence" which is the order of applying processes (recipes) to a wafer. If more than one chamber performs the same process (parallel chambers), a given processing sequence may be satisfied by several different traces.

A wafer which completes its processing sequence and is returned to the loadlock is said to be processed by the tool. Roughly speaking, a tool's throughput is the number of wafers processed by the tool per unit of time. That is, if the tool needs t seconds to process $n_t$ wafers, then $$S_t := \frac{n_t}{t} \qquad (3)$$

is the tool's throughput measured in the interval [0,t].

There are many ways to improve the tool's throughput for a given processing sequence. However, one important improvement is to use efficient scheduling routines for a given processing sequence.

The optimization of scheduling involves the choice of criteria used in deciding when to transfer a wafer from one chamber into the next (and which wafers should be moved, if any, prior to that move). A routine which schedules the movement of wafers through the cluster tool (based on a given processing sequence) is referred to as a "scheduling routine."

The steady-state throughput of a tool under scheduling routine A is denoted by S(A). If n>1 then, depending on a given processing sequence, one may consider a number of scheduling routines that fulfill the processing sequence. The routine which maximizes the value of throughput is deemed the "optimum" routine and the maximum attainable value of throughput is known as the tool's "capacity." That is, if A is the set of all possible scheduling routines for a given processing sequence, then A* is optimum if $$S(A^*)=\max\{S(A)|A\in\mathcal{A}\} \quad (4)$$

Clearly, the tool's capacity S(A*) depends on a given processing sequence as well as on chamber and robot parameters within the processing sequence. The problem of finding efficient scheduling routines for a given processing sequence (especially, finding optimum routines, where possible) is of considerable practical importance.

Presently there is not an automatic method of determining the best schedule, given a particular trace, that provides the highest throughput for that trace. Typically, a trial and error method is used until a schedule is determined that provides a sufficient throughput. However, the sufficient throughput may not be the best throughput that is possible for a given trace.

Therefore, a need exists in the art for a method and apparatus that determines all possible schedules given a particular trace and, using a throughput modeling program determines the throughput for each of the possible schedules and selects a schedule for use within a cluster tool that provides the maximum throughput for the given trace.

SUMMARY OF THE INVENTION

The disadvantages heretofore associated with the prior art are overcome by an invention of a method and apparatus for determining all possible schedules that accomplish a given trace, applying a throughput model to each of the schedules, and determining the schedule or schedules that result in the highest throughput.

More specifically, a first embodiment of the invention uses a set of deterministic rules to compute the various schedules. First, a schedule is defined as a series of "letters" that form a "word". Each letter in the word defines a possible positioning of wafers within a cluster tool. Of course, the positioning of the wafers within the tool must fulfill the trace, i.e., each letter must follow from a predecessor letter in accordance with a particular set of rules that define the trace.

Given a letter (input letter) representing present wafer positions, the invention computes all possible successor wafer positions, i.e., all possible valid successor letters, as well as the total number of successors for the input letter. The invention provides individual "modules" for successor computation for serial traces, parallel traces, and mixed traces. Using a backtracking technique to repeatedly compute, from any letter, all possible successor letters, and then compute all possible successor letters of the successor letters, a schedule tree is derived. The schedule tree contains all possible schedules that will fulfill a given trace. Each and every schedule can then be modeled to determine the expected throughput of each schedule. By comparing the throughput associated with each schedule, an optimal schedule or schedules is identified.

In a second embodiment of the invention, a method and apparatus performs successive application of three digraph based processes. First, a digraph $G_N(\{0,1\}^N,E)$ is formed to determine a directed edge from vertex $\bar{u}\in\{0,1\}^N$ to vertex $\bar{u}\in\{0,1\}^N$ only if $\bar{u}$ and $\bar{v}$ differ in at most two coordinates and $\bar{v}$ is chosen by modifying $\bar{u}$ according to the rules derived from a cluster tool's operation. N is the number of chambers in the tool, E is an edge set, u and v are coordinates representing wafer positions in the tool. Second, the invention determines simple cycles in $G_N(\{0,1\}^N,E)$ that correspond to various schedules for moving wafers through the system. Third, by using a throughput simulation program all possible cycles (schedules) are executed and the schedule that yields the highest throughput is chosen as an optimal schedule.

BRIEF DESCRIPTION OF THE DRAWINGS

The teachings of the present invention can be readily understood by considering the following detailed description in conjunction with the accompanying drawings, in which:

FIG. 8 depicts a tree diagram representing all possible schedules for a trace: $LL-C_1-(C_2, C_3)-LL$;

FIG. 8A depicts a schematic diagram of a 3-chamber mixed trace of FIG. 8 showing a wafer in position (1,1,0);

FIG. 14 depicts a chamber occupancy digraph associated with a $LL-C_1-(C_2, C_3)-LL$ wafer flow;

FIG. 14A illustrates wafer positioning in a 3-chamber cluster tool associated with the digraph of FIG. 14;

FIG. 15 depicts a chamber occupancy digraph associated with a $LL-(C_1, C_2)-C_3-LL$ wafer flow;

FIG. 15A illustrates wafer positioning in a 3-chamber cluster tool associated with the digraph of FIG. 15;

To facilitate understanding, identical reference numerals have been used, where possible, to designate identical elements that are common to the figures.

DETAILED DESCRIPTION

A. Overview of the Invention

As discussed above, FIG. 1 depicts, in part, a schematic diagram of a conventional multiple chamber semiconductor wafer processing tool. The depicted cluster tool 100 is controlled by a sequencer that executes the scheduling routines determined by the present invention. The present invention is embodied in a schedule generator 50 that produces scheduling routines which are executed by the sequencer 136.

Figure 1:
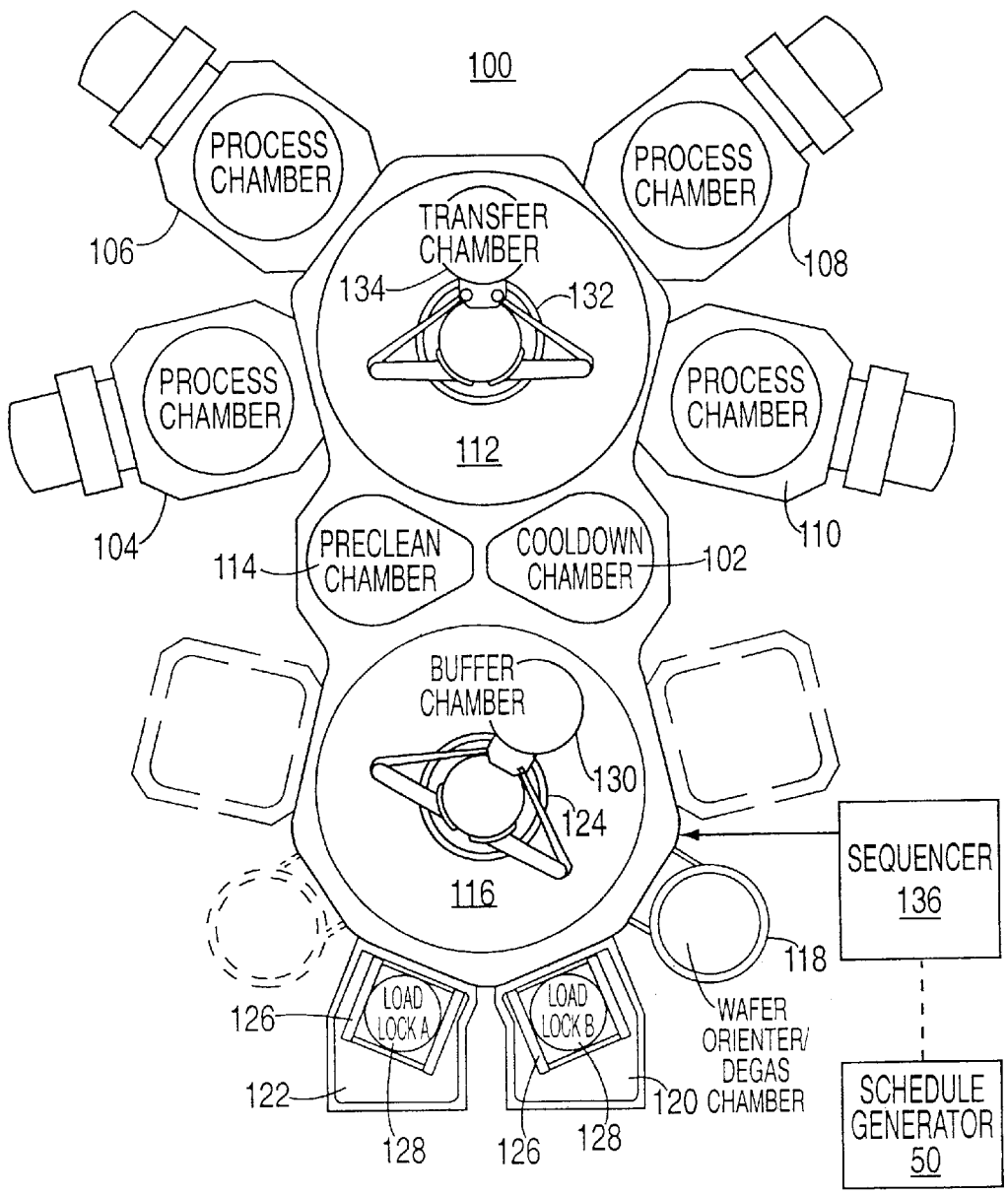
FIG. 1 depicts a schematic diagram of a multiple chamber semiconductor wafer processing tool being controlled by a sequencer that operates using scheduling routines generated by a schedule generator in accordance with the present invention.
Figure 2:
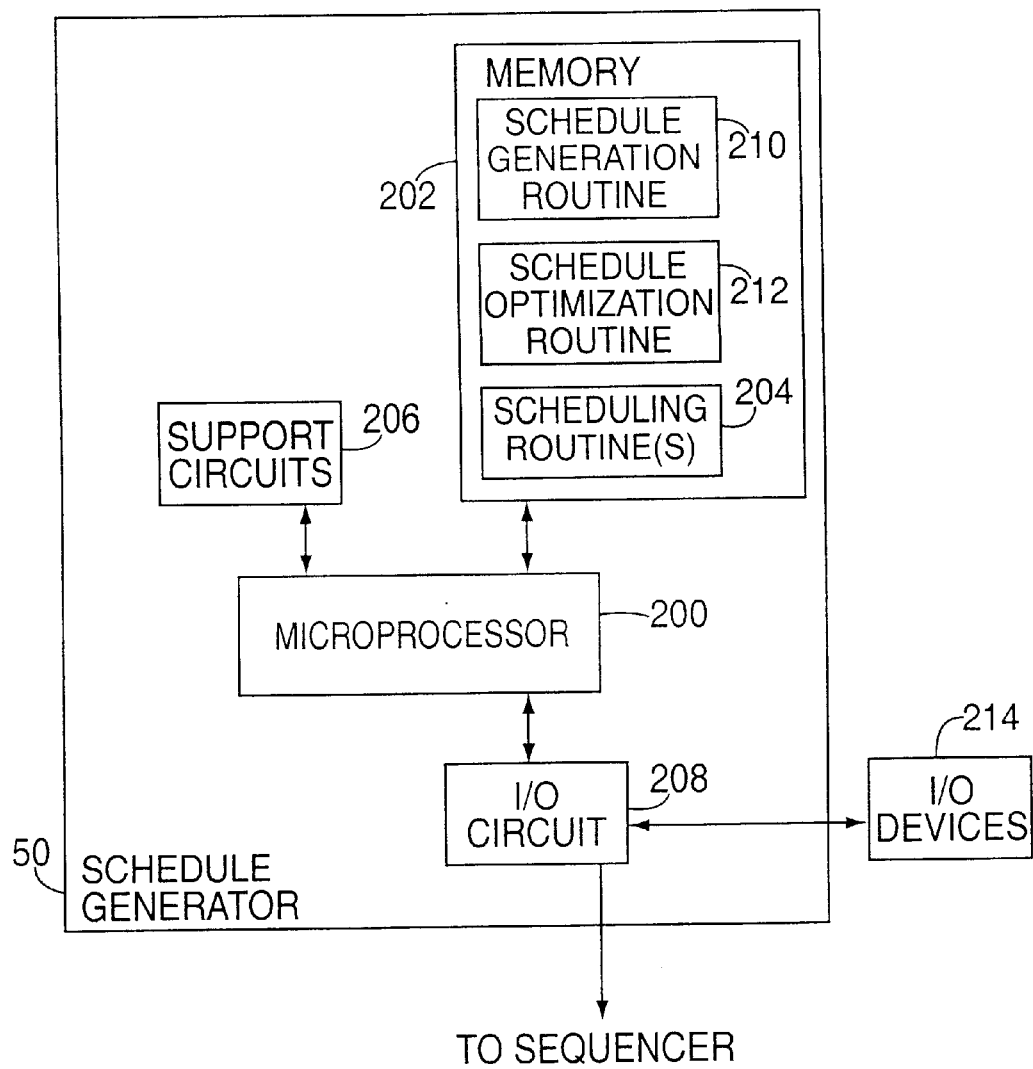
FIG. 2 depicts block diagram of schedule generator that performs operative steps in accordance with the present invention.

FIG. 2 depicts a block diagram of the scheduling generator 50 that produces the scheduling routines executed by the sequencer to control the cluster tool 100 of FIG. 1. Additionally, the schedule generator 50 operates to determine an optimal sequencing routine for a given processing sequence and tool configuration. Although, the schedule generator is shown to remotely produce schedules and download one or more schedules to the sequencer, those skilled in the art will understand that the invention could be practiced on a processor within the sequencer.

The schedule generator 50 contains a microprocessor 200 as well as memory 202 for storing a schedule generation routine 210, a schedule optimization routine 212 and the scheduling routine(s) generated by routines 210 and 212. The microprocessor 200 cooperates with conventional support circuitry 206 such as power supplies, clock circuits, cache, and the like as well as circuits that assist in executing the software routines. As such, it is contemplated that some of the process steps discussed herein as software processes may be implemented within hardware, e.g., as circuitry that cooperates with the microprocessor to perform various process steps. The schedule generator 50 also contains input/output circuitry 208 that forms an interface between conventional input/output (I/O) devices 214 such as a keyboard, mouse, and display as well as an interface to the sequencer. Although the schedule generator 50 is depicted as a general purpose computer that is programmed to determine scheduling routines in accordance with the present invention, the invention can be implemented in hardware as an application specific integrated circuit (ASIC). As such, the process steps described herein are intended to be broadly interpreted as being equivalently performed by software, hardware, or a combination thereof.

The automatic schedule generator 50 of the present invention executes a schedule generation routine 210 that generates all possible schedules for a given trace. A schedule optimization routine 212 facilitates an automated process of producing an optimum schedule for a given cluster tool using an exhaustive search of all possible schedules.

The following definitions are used throughout this disclosure:

"Tool configuration" describes physical placement of chambers within a cluster tool. For example, the tool may have chambers $C_1, C_2, C_3$ and $C_4$, a LoadLock (LL) as well as one or more robots.

"Process sequence" is the order in which processes are applied to a given wafer. For example, $P_n$ is the name of the n-th process (e.g., etch) and, $P_1, P_2, P_3$, (which also may be written as $P_1 \rightarrow P_2 \rightarrow P_3$) is a process sequence.

"Processing capability" of a cluster tool is the result of mapping a required process sequence onto the set of chambers within the tool. The image of this mapping is called a "trace". For example, a process sequence $P_1 \rightarrow P_2 \rightarrow P_3$ may be mapped onto four chambers $C_1, C_2, C_3$ and $C_4$ to yield a trace $$LL \rightarrow C_1 \rightarrow (C_2 v C_3) \rightarrow C_4 \rightarrow LL.$$

Note that processes $P_1$ and $P_3$ are mapped into chambers $C_1$ and $C_4$, respectively, while process $P_2$ is mapped into $C_2 v C_3$ (the process $P_2$ is performed in both $C_2$ and $C_3$). Chambers $C_2$ and $C_3$ are said to be parallel because a wafer visits (is placed into) either $C_2$ or $C_3$ (but not both). In other words, the sign v in $C_2 v C_3$ represents an exclusive OR function.

"Stage" is a set of one or more chambers which correspond to the same process. Wafers visit exactly one chamber from a given stage. The notation $(C_x v C_y v C_z)$ means that wafers can move to either chambers $C_x$ or $C_y$ or $C_z$, but only into one of the chambers. That is, $(C_x v C_y v C_z)$ is a stage comprised of three "parallel, chambers.

Generally speaking, the term "schedule" means a finite and repeatable sequence of wafer and robot movements through the cluster tool. More formally, let S be the set of all possible wafer and robot states. A string of symbols (letters) from a finite set of states S is referred to as a word. Symbols are represented as letters from the alphabet S. For example, if $S=\{0,1\}^2$, then (0,0), (0,1), (1,0), and (1,1) are all possible letters in alphabet S and (0,1) (1,1) (0,1) is a word having a length of 3 letters over S. Each letter identifies the instantaneous state of the tool. For example, as is discussed in detail below, a letter may define the particular positioning of a wafer or wafers within a tool at a particular point in the trace.

Broadly speaking, whatever the specific alphabet, a schedule S is represented as a word, S=xyz . . . uv . . . urtx, which starts and ends with the same letter (e.g., x), this is the only repeated letter, and a successor v of a given letter u must satisfy alphabet dependent rules, i.e., rules which define a valid trace.

Figure 3:
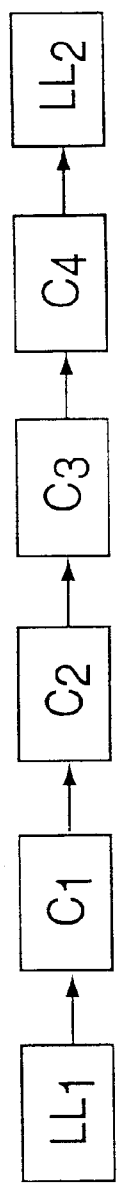
FIG. 3 depicts a flow diagram of a 4-chamber serial trace.
Figure 4:
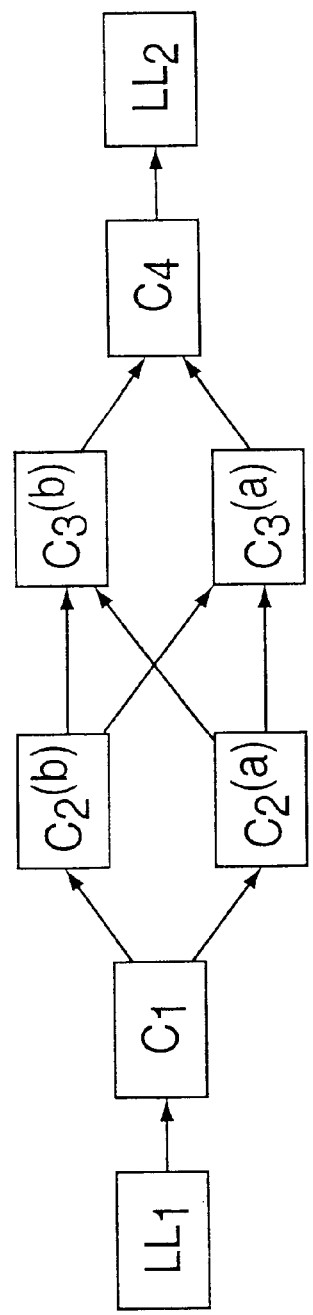
FIG. 4 depicts a flow diagram of a 4-chamber mixed trace.

Traces are available in three different configurations, A trace is parallel if it is comprised of exactly one stage; a trace is serial if each stage has exactly one chamber and a trace is mixed if it is neither serial nor parallel. (Clearly, to have a mixed trace, the number of chambers in the trace is at least three.) A trace is said to be knotted if there is a chamber whose name appears more than once in the trace (that is, the corresponding process sequence contains a processing loop). To illustrate, FIGS. 3 and 4 schematically depict 4-stage serial and mixed traces, respectively.

Figure 5:
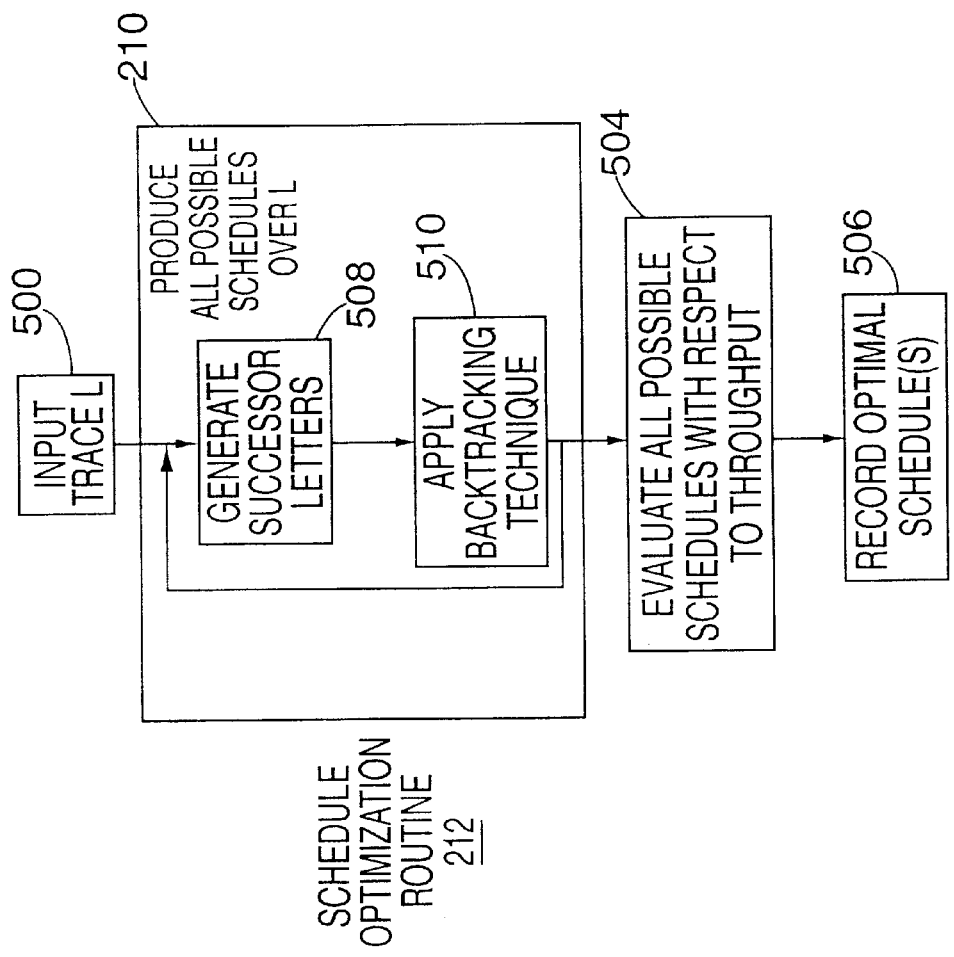
FIG. 5 depicts a flow diagram of a schedule optimization routine of the present invention.

FIG. 5 depicts a high level flow diagram of the schedule optimization routine 212. The optimization routine contains a schedule generation routine 210 that produces all possible schedules in an alphabet induced by a given trace. Routine 212 is an automated process that performs the following steps:

a) Input a trace L (step 500), b) Produce all possible schedules over L (routine 210) using a two step process, where the first step (step 508) generates all possible successor positions (letters) to which a wafer can be moved from a present position (letter) and the second step (step 510) uses a backtracking technique to change wafer positions such that other successor positions (letters) can be computed by step 508, c) Evaluate each of the schedules in (b) with respect to throughput (for a given set of robot and process parameters) (step 504), d) Record a schedule or a set of schedules which have the highest throughput for the given trace L (step 506).

Since step (c) requires a throughput simulation program, for computational efficiency, steps (a), (b) and (d) are generally incorporated into the simulation program.

A plurality of embodiments of the present invention are discussed below in Sections B, C, D and E of this disclosure. Specifically, the definitions of a schedule in a $\{0,1\}^n$ alphabet, rules for generating successors of a given letter, and modules needed for computation of successors are given in Section B for a serial trace and Section C for mixed and parallel traces. In Section D, these processes are extended to include robot utilization in the computations. Lastly, a generalized backtracking routine for generating all possible schedules from a given trace, applicable to any trace with or without a robot, is presented in Section E.

B. Schedule Generation for Serial Traces Using n-Tuples

An n-chamber serial trace (as illustratively depicted in FIG. 3), comprised of chambers $C_1, C_2, \ldots C_n$, is associated with an n-tuple from the alphabet $\{0,1\}^n$. If $\bar{x}$ is such a tuple, then, for i=1,2, ..., n; $\bar{x}[i]$=0, if chamber $C_i$ is empty, and $\bar{x}[i]$=1, if $C_i$ contains a wafer. In accordance with this representation, a schedule S is a finite string of binary n-tuples, $$S=\bar{x} \ldots \bar{u}\,\bar{v} \ldots \bar{x},$$

which starts and ends with the same binary n-tuple and this is the only repeated n-tuple in the string. In addition, any two consecutive n-tuples $\bar{u}$ and $\bar{v}$ in the string, $\bar{v}$ being a successor of $\bar{u}$, differ in at most two coordinates and are related in accordance with the following rules:

$s_1$) If $\bar{u}[1]$=0, then $\bar{v}[1]$=1. For all k>1, $\bar{v}[k]$=$\bar{u}[k]$. (This corresponds to a wafer being moved from the loadlock into $C_1$.)

$s_2$) If $\bar{u}[n]$=1, then $\bar{v}[n]$=0. For all k<n, $\bar{v}[k]$=$\bar{u}[k]$. (This corresponds to a wafer being moved from $C_n$ into the loadlock).

$s_3$) If, for some k∉{0,n}, $\bar{u}[k]$=1 and $\bar{u}[k+1]$=0, then $\bar{v}[k]$=0 and $\bar{v}[k+1]$=1. For all i∉{k,k+1}, $\bar{v}[i]$=$\bar{u}[i]$. (This corresponds to a wafer being moved from $C_k$ into $C_{k+1}$.)

Figure 6:
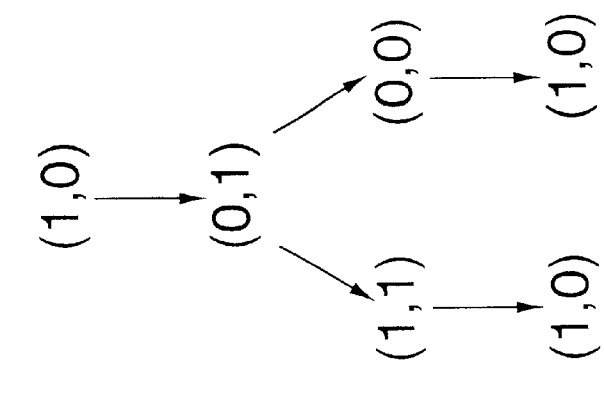
FIG. 6 depicts a tree diagram representing all possible schedules for a 2-chamber serial trace.
Figure 6A:
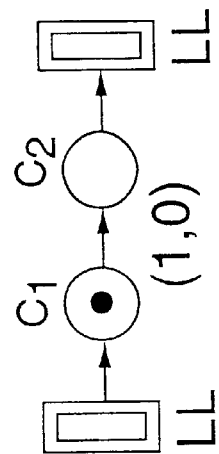
FIG. 6A depicts a schematic diagram of a 2-chamber serial trace of FIG. 6 showing a wafer in position (1,0)

FIG. 6 illustrates all possible schedules available (i.e., two schedules) in a 2-chamber serial trace. FIG. 6A depicts a schematic diagram of the 2-chamber serial trace of FIG. 6 having a wafer in position represented by the 2-tuple (1,0). These n-tuples are referred to herein as the coordinates of wafer positioning. From position (1,0), the schedule of FIG. 6 dictates that the wafer is next moved to a position represented by the 2-tuple (0,1), i.e., a wafer is now in chamber $C_2$ and no wafer is in chamber $C_1$. Thereafter, the schedule may follow one of two paths, either the wafer in $C_2$ is moved to the loadlock (a wafer positioning that is represented by 2-tuple (0,0)) or another wafer is moved into chamber $C_1$ (a wafer positioning that is represented by 2-tuple (1,1)). As such, each 2-tuple represents a set of possible positions for a wafer or wafers that validly fulfill a step in the trace.

Figure 7:
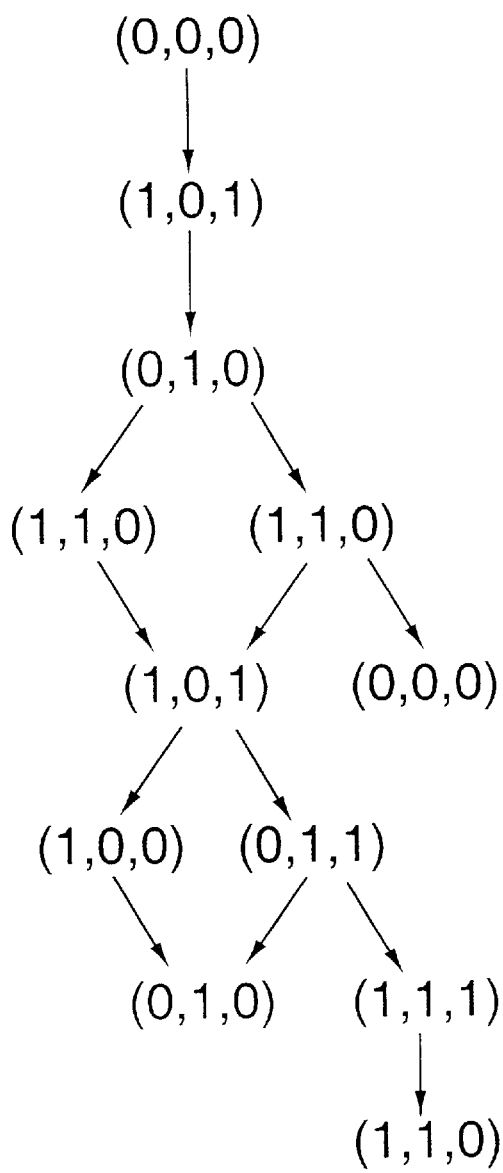
FIG. 7 depicts a tree diagram representing all possible schedules for a 3-chamber serial trace.
Figure 7A:
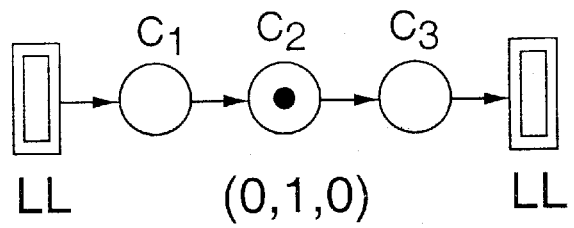
FIG. 7A depicts a schematic diagram of a 3-chamber serial trace of FIG. 7 showing a wafer in position (0,1,0)

Similarly, FIG. 7, illustrates the seven possible schedules available in a 3-chamber serial trace and FIG. 7A depicts a schematic diagram of the trace of FIG. 7 having a wafer positioning represented by the 3-tuple (0,1,0). From FIG. 7, the strings $S_p$=(1,1,1) (1,1,0) (1,0,1) (0,1,1,) (1,1,1)

$S_w$=(1,0,0) (0,1,0) (0,0,1) (0,0,0) (1,0,0)

$S_x$=(1,0,1) (0,1,1) (0,1,0) (1,1,0) (1,0,1).

represents particular scheduling routines that are generated by the schedule generator for a three chamber serial trace.

Such schedules may contain a set of robot and chamber parameters that yield higher or lower throughput than other schedules in the set of all schedules. As such, the only way to determine an optimum schedule is to examine the throughput under all possible schedules and, using the optimization routine, determine which of the schedules is optimal.

As mentioned above, the $2^n$ binary n-tuples (position coordinates) are regarded as letters from the alphabet $\{0,1\}^n$. A finite string of letters is referred to as a word. For example, strings $S_p$, $S_w$, and $S_x$ are all 5-letter words. In this terminology, a partial schedule S of length k is a k-letter word S(1))S(2)) ... S(k) in which next letter S(i+1) depends only on the previous letter S(i), i=1,2, ..., k−1, and is built according to rules $(s_1)$ $(s_2)$, and $(s_3)$ stated above. In accordance with these rules, all letters in a partial schedule are different. A full schedule is a word W(1))W(2)) ... W(n) such that W(1))W(2)) ... W(n−1) is a partial schedule and W(n)=W(1)). For example, the word W=(1,1,1) (1,1,0) (1,0,1) (0,1,1) is a partial schedule, where W(1))=(1,1,1) and W(4)=(0,1,1). (Generally, if $W=\bar{u}_1\bar{u}_2 \ldots \bar{u}_k$, then $W(i)=\bar{u}_i$).

From the definition of a schedule, if $\bar{u}_1\bar{u}_2 \ldots \bar{u}_k$ is a partial schedule, then $\bar{u}_1\bar{u}_2 \ldots \bar{u}_k\bar{u}_{k+1}$ is also a schedule (partial or full) $\bar{u}_{k+1}$ is obtained from $\bar{u}_k$ according to rules $(s_1)$, $(s_2)$, and $(s_3)$. A given letter $\bar{u}_k$ may have anywhere from 1 to [n/2]=1 successors $\bar{u}_{k+1}$. The number of successors (variable nmb below) is easily determined by the following function:

```
function SerCount(ū_k:letter): integer;
    var
        i, nmb:integer;
    begin
        nmb:=0
        for i:=1 to n−1
            if ū_k[i]=1 and ū_k[i+1]=0
                then nmb:=nmb+1;
        nmb:=nmb+ū_k[n] + ((1+ū_k[1]) (mod 2))
        return (nmb)
    end;
``` where SerCount $(\bar{u}_k)$ represents the number of successors of $\bar{u}_k$ in a serial n-chamber trace. Since, in an exhaustive search, all the successors are examined, the foregoing pseudo-code determines the total number of successor letter that must be computed to complete an exhaustive search.

Generating all SerCount $(\bar{u})$ successors of a given letter $\bar{u}$ is not particularly difficult. As each successor of $\bar{u}$ is generated, it is stored in a binary matrix Z that has SerCount $(\bar{u})$ rows and (n+1) columns. The last column of Z is reserved for a Boolean variable that is set to true if the successor was not used. This entry is used later in the backtracking routine (discussed below with reference to FIG. 10) that generates all possible schedules for a given trace. The successors of a given letter are determined by the following function.

```
function SerGenerator (ū:letter) : matrix;
var
    i:integer;
begin
    if ū[1] = 0 then begin
        copy (ū, v̄);
        v̄[1] := 1;
        store(v̄, Z);
    end;
    if ū[n] = 1 then begin
        copy (ū, v̄);
        v̄[n] = 0;
        store (v̄,Z);
    end;
    for i:=1 to n−1
        if ū[i]=1 and ū[i+1]=0 then begin
            copy (ū, v̄);
            v̄[1]=0; v̄[i+1]:=1;
            store (v̄,Z);
        end;
    return (Z);
end;
```

There are two functions which are used repeatedly in the above pseudo-code. Function copy (ū,v̄) returns letter ū that is a replica of letter v̄. This manner of implementing rules ($s_1$), ($s_2$) and ($s_3$), in which the routine first copies ū and ū and then modifies ū, is not inefficient because ū and v̄ differ in at most two coordinates. Function store (v̄,Z) copies letter v̄ into a proper row of matrix Z. Note that in the above module, the routine copies a binary n-tuple twice; clearly, in inplementation, the routine copies the successor of ū (slightly altered n-tuple ū) into the proper row of matrix Z directly.

Using the foregoing pseudo-code and given a letter ū in a serial trace, the pseudo-code generates all possible successor letters of ū and stores them in matrix Z. For example, in FIG. 7, given the letter (0,0,0), the e.g., letters (1,0,1), (0,1,0), (1,1,0), and (0,0,0). Given a different initial letter, a different valid set of successors is produced, e.g., letter (0,1,0) may produce letters (1,1,0), (1,0,1), (1,0,0) and (0,1,0).

C. Successor Generatin Using n-tuples

The representation of an n-chamber mixed trace by a binary n-tuple is slightly more involved because exactly one chamber from a given stage is visited by a wafer and there are no wafer transfers within the stage. Thus, the schedule generation routine must recognize different stages as well as parallel chambers within a stage. FIG. 4 depicts an illustrative mixed trace containing four stages with six chambers, where chambers $C_1$ and $C_4$ are serial and chamber pairs $C_2(a)$, $C_2(b)$ and $C_3(a)$, $C_3(b)$ are parallel.

Without loss of generality, it is assumed that an n-chamber mixed trace is comprised of k successive stages, $F_1, F_2, \ldots, F_k$, $k \leq n$. If 1,2, ..., n are positions in a binary n-tuple x̄ that corresponds to chambers $C_1, C_2, \ldots, C_n$, respectively, then positions 1,2, ..., $|F_1|$ corresponds to chambers in stage 1, positions $|F_1|+1, |F_1|+2, \ldots |F_1|+|F_2|$ correspond to chambers in stage 2, and so on. If chamber $C_i$ belongs to stage $F_t$, then position i in the corresponding associated binary n-tuple x̄ belongs to $F_t$ and $i \in F_t$ (while, in fact, i is one of the consecutive $|F_t|$ positions in x̄).

In this representation, a schedule is a finite string of binary n-tuples which starts and ends with the same binary n-tuple. This is the only repeated letter in the word. In addition, if v̄ is a successor of ū, then ū and v̄ differ in at most two coordinates and the following rules define the relationship of ū and v̄:

$m_1$) If for some $i \in F_1$, ū[i]=0, then v̄[i]=1. For all k≠i, v̄[k]=ū[k] (This corresponds to a wafer being moved from the loadlock into stage 1.)

$m_2$) If for some $i \in F_k$, ū[i]=1, then v̄[i]=0. For all j≠i, v̄[j]= ū[j]. (This corresponds to a wafer being moved from the last stage $F_k$ into the loadlock).

$m_3$) If for some $i \in F_t$ and some $j \in F_{t+1}$, ū[i]=1 and ū[j]=0, then v̄[i]0 and v̄[j]=1. For all $r \notin \{i,j\}$, v̄[r]=ū[r]. (This corresponds to a wafer being moved from stage $F_t$ into the next stage $F_{t-1}$)

In determining the number of successors of a given letter ū, it will be handy to define a sequence $M_o=0$ and $$M_t=|F_1|+|F_2|+ \ldots +|F_t|,$$

where $|F_t|$ is the size (number of chambers) of stage $F_t$. The above sequence reflects the partition of the index set of ū into stages. Clearly, $M_k=n$, where n is the number of chambers. The number of successors of ū is determined by the following function:

```
function MixCount(ū:letter):integer;
var
    t, i, j, nmb:integer;
begin
    nmb:=0
    for i:=1 to M_1
        if ū[i]= 0
        then nmb:=nmb+1
    for j:=1+M_{k−1} to M_k
        if ū[i] = 1
        then nmb:=nmb+1
    for t:=1 to k−1
    for i:=1+M_{t−1} to M_t
    for j:=1+M_t to M_{t+1}
        if ū[i] = 1 and ū[j] = 0
        then nmb:=nmb+1;
    return (nmb)
end;
```

Obviously, if $M_t=t$ and k=n in the above pseudo-code, then MixCount(ū) becomes SerCount(ū). Also, for a pure parallel n-chamber trace, due to k=1, the 3-nested "for" statements in the above pseudo-code are null; by joining the first two loops (since there is just one stage), the pseudo-code reduces to:

```
function ParCount (ū : letter) : integer;
var
    i,nmb:integer;
begin
    nmb:=0;
    for i:=1 to n
        if ū[i] = 0 or ū[i] = 1
        then nmb:=nmb+1;
    return (nmb)
end;
``` which always returns nmb=n. Thus, in a pure parallel n-chamber trace, any given letter has n successors.

A function that generates and stores all successors of a given letter in a mixed trace is:

```
function MixGenerator (ū:letter) :matrix;
var
    t,i,j:integer;
begin
```

-continued

```
    for i:=1 to M₁
        if u[i] = 0 then begin
            copy (u, v);
            v[i]:=1;
            store(v, Z)
        end;
    for j:=1+M_{k-1} to M_k
        if u[j]=1 then begin
            copy(u, v);
            v[j]:=0;
            store (v, Z)
        end;
    for t:=1 to k-1
        for i:=1+M_{t-1} to M_t
        for j:=1+M_t to M_{t+1}
            if u[i] = 1 and u[j] = 0 then begin
                copy (u, v);
                v[i]:=0; v[j]:=1;
                store (v, Z)
            end;
    return (Z);
end;
```

Functions copy $(\bar{u},\bar{v})$ and store $(\bar{v},Z)$ are the same as in the corresponding routine for serial traces. (Note that this time matrix Z has MixCountu rows and (n+1) columns.) Again, if $M_t$=t and k=n in the above function, then MixGenerator($\bar{u}$) becomes SerGenerator($\bar{u}$). For pure parallel traces, due to k=1, a function that generates successors of a given letter $\bar{u}$ is:

```
function ParGenerator (u: letter) :matrix;
var
    i:integer;
begin
    for i:=1 to n
    begin
        copy (u, v);
        if u[i] = 1
        then v[i]:=0
        else v[i]:=1
        store (v, Z)
    end;
    return (Z)
end;
```

Note the similarity between functions that count successors and functions that generate successors. In fact, conditions for identifying a successor are identical in both types of function; the difference is what is performed once the condition is detected.

FIG. 8 depicts an illustrative schedule tree for a 3-chamber mixed trace, (e.g., LL→$C_1$→($C_2$v$C_3$)→LL), where the successors of a particular letter are determined using the MixGenerator($\bar{u}$) pseudo-code. FIG. 8A depicts a schematic diagram of the trace of FIG. 8 having wafers positioned in position (1,1,0).

D. Successor Generation That Includes Robot Position

When the schedule generation routine includes robot movements, than to an n-chamber serial trace, comprised of chambers $C_1, C_2, \ldots, C_n$, the routine must associate a (n+1)-tuple from $\{0,1\}^n \times \{0,1 \ldots, n\}$. If $\bar{x}$ is such a tuple, then, for i=1,2, ..., n, $\bar{x}[i]=0$, if chamber $C_i$ is empty; and $\bar{x}[i]=1$, if $C_i$ contains a wafer. Thus, as before, the first n coordinates of $\bar{x}$ are from $\{0,1\}$. The robot position is described by the last coordinate of $\bar{x}$, i.e., $x_3$ in the 3-tuple $(x_1,x_2;x_3)$, where $x_1$ and $x_2$ are wafer coordinates and $x_3$ is a robot coordinate. We set $\bar{x}[n+1]$=k if (and only if) the robot is in a home position at chamber $C_k$. If $\bar{x}[n+1]$=0, the robot is positioned at the loadlock.

Let $S_n$ represent the alphabet of the above association. For example, if n=2, then $S_2$ is comprised of twelve 3-tuples, namely, $S_2$={(0,0;0), (0,0;1), (0,0;2); (0,1;0), (0,1;1), (0,1;2); (1,0;0), (1,0;1), (1,0;2); (1,1;0), (1,1;1), (1,1;2)}.

For an n-chamber serial trace, $|S_n|$ is the number of (n+1)-tuples from $\{0,1\}^n(\{0,1, \ldots, n\}$ and thus $|S_n|=(n+1)2^n$. These (n+1)-tuples are referred to as letters from the alphabet $S_n$. As before, a word is a finite string of letters from $S_n$. For example, (0,0;0) (1,0;1) (0,1;2) (0,1;0) (1,1;1) (1,1;2) (1,0;0) (1,0;1)

is an 8-letter word. Note that a word may contain repeated letters. For example, abcdaxy is a word, but not a schedule.

In this representation, a schedule S is a word (a string of the above described (n+1)-tuples), $S = \overline{xz} \ldots \overline{uv} \ldots \overline{yx} \ldots$, which starts and ends with the same letter and this is the only repeated letter. Furthermore, any two consecutive letters $\bar{u}$ and $\bar{v}$(where $\bar{v}$ is a successor of $\bar{u}$) differ in at most three coordinates and are related in accordance with the following rules:

a) If $\bar{u}[1]=0$ and $\bar{u}[n+1]=0$, then $\bar{v}[1]=1$ and $\bar{v}[n+1]=1$. For all $i \notin \{1,n+1\}$, $\bar{v}[i]=\bar{u}[i]$. (This correspondence to a wafer being moved from the loadlock to $C_1$.)

b) If $\bar{u}[n]=1$ and $\bar{u}[n+1]=n$, then $\bar{v}[n]=0$ and $\bar{v}[n+1]=0$. For all $i \notin \{n,n+1\}$, $\bar{v}[i]=\bar{u}[i]$. (This corresponds to a wafer being moved from $C_n$ into the loadlock.)

c) If for some $r \notin \{0,n\}$, $\bar{u}[r]=1$ and $\bar{u}[r+1]=0$ and $\bar{u}[n+1]=r$, then $\bar{v}[r]=0$ and $\bar{v}[r+1]=1$ and $\bar{v}[n+1]=r+1$. For all $i \notin \{r,r+1,n+1\}$, $\bar{v}[i]=\bar{u}[i]$. (This corresponds to a wafer being moved from $C_k$ into $C_{(k+1)}$, where neither $C_k$ nor $C_{(k+1)}$ is a loadlock.)

d) If $\bar{u}[1]=0$ and $\bar{u}[n+1]=j$ where $j \neq 0$, then $\bar{v}[n+1]=0$. For all $i \neq n+1$, $\bar{v}[i]=\bar{u}[i]$. (This corresponds to a robot moving from home position at $C_j$ to a home position at a loadlock in preparation for a wafer moving from the loadlock into $C_1$.)

e) If $\bar{u}[n]=1$ and $\bar{u}[n+1]=j$ where $j \neq n$, then $\bar{v}[n+1]=n$. For all $i \neq n+1$, $\bar{v}[i]=\bar{u}[i]$. (This corresponds to a robot moving from a home position at $C_j$ to a home position at $C_n$ in preparation for a wafer move from $C_n$ into loadlock.)

f) If for some $r \notin \{0,n\}$, $\bar{u}[r]=1$ and $\bar{u}[r+1]=0$ and $\bar{u}[n+1]=j$ where $j \neq r$, then $\bar{v}[n+1]=r$. For all $i \neq n+1$, $\bar{v}[i]=\bar{u}[i]$. (This corresponds to a robot moving from a home position at $C_i$ to a home position at $C_r$ in preparation for a wafer moving from $C_r$ into $C_{r+1}$; $C_o$ represents the loadlock.)

Note that rules (a), (b), and (c) above are, in fact rules ($s_1$), ($s_2$), and ($s_3$), respectively, when the robot is already prepositioned to move a wafer, while (d), (e), and (f) correspond to prepositioning the robot for moves defined by rules (a), (b), and (c), respectively.

A routine that calculates the number of successors of a given letter as well as finds and stores these successors is designed in a similar manner as in the previous cases for mixed and serial traces (this time by following the steps (a) through (f)). In such a routine, the number of successors is considerably large because, every time a wafer transfer is possible (e.g., $\bar{u}[i]=0$ or $\bar{u}[n]i=1$ or $\bar{u}[i]=1$ and $\bar{u}[i+1]=0$, a robot may have to be prepositioned (e.g., from any of the n−1 positions $j \neq 0$ or $j \neq n$ or $j \neq i$). To achieve routines for determining the number of successors and the successors themselves that includes robot position, the new functions used are modifications of SerCount($\bar{u}$) and SerGenerator($\bar{u}$) (or MixCount($\bar{u}$) and MixGenerator($\bar{u}$)). Given the foregoing description of SerCount($\bar{u}$), SerGenerator($\bar{u}$), MixCount($\bar{u}$) and MixGenerator($\bar{u}$), a person skilled in the art could readily modify these functions to account for robot position using the aforementioned rules (a)–(f).

E. Generating Schedules From A Trace Using a Backtracking Technique

Backtracking algorithms use special problem-tailored techniques to systematically explore implicitly directed graphs (usually trees). Such algorithms are well known in the art. In the schedule generation routine, a backtracking algorithm is used in conjunction with one or more of the previously discussed successor generation routines (e.g., SerGenerator($\bar{u}$) or MixGenerator($\bar{u}$)) to produce every possible schedule given a particular trace.

Let $\bar{u}_1$ be the starting letter of a schedule. By using the rules for adding a successor letter as discussed in Sections B, C or D above, the foregoing routines build a partial schedule, say $S = \bar{u}_1 \bar{u}_2 \ldots \bar{u}_k$. There are two questions to answer every time a new letter $\bar{u}_{k+1}$ is added to partial trace S:

a) Is $\bar{u}_1 \bar{u}_2 \ldots \bar{u}_k \bar{u}_{k+1}$ a full schedule?

b) If $\bar{u}_1 \bar{u}_2 \ldots \bar{u}_k \bar{u}_{k+1}$ is a full schedule, are there other full schedules which have not been recorded?

A word $\bar{u}_1 \bar{u}_{k+2} \ldots \bar{u}_{k+1}$ is recognized as a full schedule if it is built according to rules for successor letters and if there exists an index i<k+1 such that $\bar{u}_i = \bar{u}_{k+1}$ and all letters $\bar{u}_1 \bar{u}_2 \ldots \bar{u}_k$ are different. Thus, to determine a full schedule a routine checks whether or not $\bar{u}_{k+1} \neq \bar{u}_i$, i=1,2, ..., k, for every newly appended letter $\bar{u}_{k+1}$ which is a proper successor of $\bar{u}_k$.

Once it is found that $\bar{u}_i = \bar{u}_{k+1}$ for some i<k+1, the routine either prints or stores the full schedule $\bar{u}_i \bar{u}_{i+1} \ldots \bar{u}_{k+1}$. To find other schedules, the routine removes $\bar{u}_{k+1}$ from the full schedule S and looks at some other unused successor of $\bar{u}_k$. If there is such a successor, say letter $\bar{z}$, the routine checks if $\bar{u}_1 \ldots \bar{u}_k \bar{z}$ is a full schedule. If $\bar{u}_1 \ldots \bar{u}_k \bar{z}$ is not a full schedule, the routine looks at unused successors of $\bar{z}$ and so on. If $\bar{u}_1 \ldots \bar{u}_k \bar{z}$ is a full schedule, the routine removes $\bar{z}$ and looks at another unused successor of $\bar{u}_k$. If there are no unused successors of $\bar{u}_k$, the routine goes back (backtrack) and looks at unused successors of $\bar{u}_{k-1}$ and so on, until the routine returns to the starting letter $\bar{u}_1$. Basically, the routine contains the following sequence of steps:

1. (Initialize.) Choose the letter $\bar{u}_1$ of a schedule and go to Step 2.
2. If schedule $\bar{u}_1 \bar{u}_2 \ldots \bar{u}_k$ is not complete, go to step 3. Else, go to Step 4.
3. Find a successor letter (of the last letter $\bar{u}_k$, in the schedule) which was not used, append it to the partial schedule and go to Step 2. If there are no unused successors, go to step 5.
4. Print or store the schedule and go to Step 5.
5. If there are no more schedules, then STOP. Else, go to Step 6.
6. (Backtrack.) Remove the last letter from the complete schedule and go to Step 3.

Clearly, the routine must ensure that it does not print (store) duplicate schedules in Step 4 as well as that the routine has printed (stored) all possible schedules. The former is accomplished in Step 3 where the routine appends only an unused successor of the last letter to the partial schedule. The latter is ensured by a proper termination condition (for example, the routine is at $\bar{u}_1$ (the initial letter) and there are no unused successors). It is convenient to choose the first letter $\bar{u}_1$ so that it has only one successor, e.g., $\bar{u}_1 = \bar{O}$ or $\bar{e}_1$, where $\bar{e}_k$ is the k-th column (row) of an n by n identity matrix.

Figure 9:
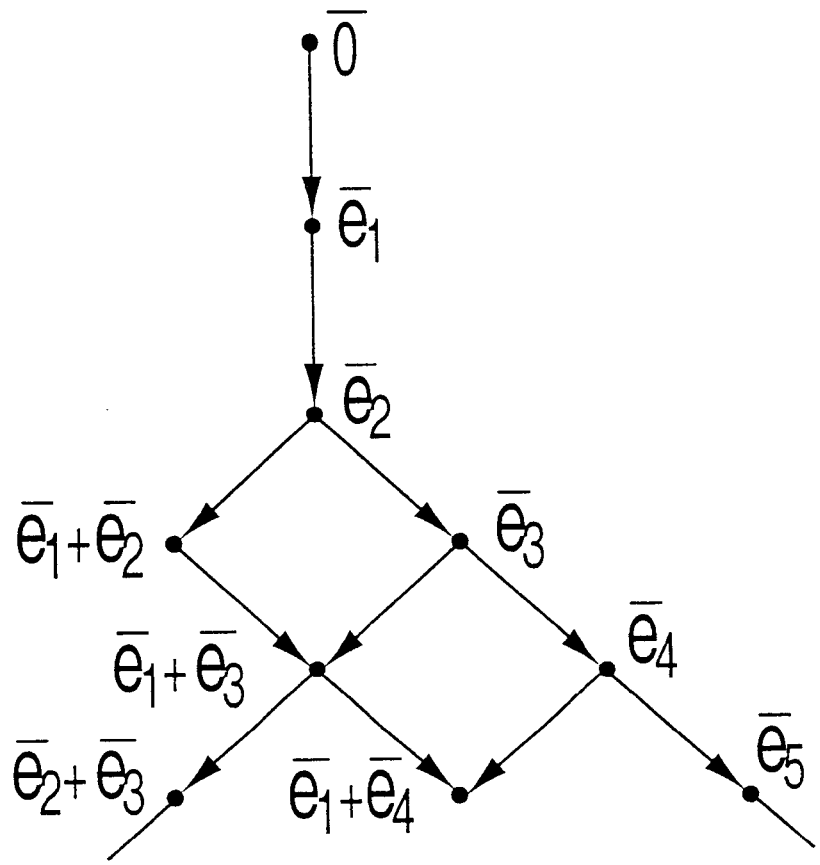
FIG. 9 depicts a tree diagram containing partial schedules as constructed using the present invention.

For example, as illustrated in FIG. 9, starting with letter $\bar{O}$, the routine builds a tree whose nodes are letters. If $\bar{x}$ is such a node, the children of $\bar{x}$ are successors of a letter $\bar{x}$ and, for serial traces, there are exactly SerCount($\bar{x}$) of the successors. As such, the routine produces $\bar{O}$, $\overline{Oe_1}$ and $\overline{Oe_1}$ and $\overline{Oe_1 e_2}$ as successive partial schedules. (The word $\overline{Oe_2}$ is a directed path from node $\bar{O}$ to node $\bar{e}_2$.) Since $\bar{e}_1 + \bar{e}_2$ and $\bar{e}_3$ are successors (children) of $\bar{e}_2$, words $\overline{Oe_1 e_2}$ ($\bar{e}_1 + \bar{e}_2$) and $\overline{O e_1 e_2 e_3}$ are partial schedules as well. Now, $\bar{e}_3$ has two successors ($\bar{e}_1 + \bar{e}_3$ and $\bar{e}_4$), while $\bar{e}_1 + \bar{e}_2$ has only one successor ($\bar{e}_1 + \bar{e}_3$). Hence, $\overline{Oe_1 e_2}$ ($\bar{e}_1 + \bar{e}_2$) ($\bar{e}_1 + \bar{e}_3$) and $\overline{Oe_1 e_2 e_3}$ ($\bar{e}_1 + \bar{e}_3$) and $\overline{Oe_1 e_2 e_3 e_4}$ are all partial schedules and so on.

As mentioned previously, letters comprising a given word (or partial schedule) S are distinguished by their positions; so S(1) is the first letter in S, S(2)) is the second, and so on. The level of a search tree is denoted by L this is also the length of a partial schedule. Partial schedules of length L are thus paths of length L in a search tree. Function scnt($\bar{x}$) returns the number of successors of $\bar{x}$. As such scnt($\bar{x}$) is either SerCount($\bar{x}$) or MixCount($\bar{x}$) or either of these for a model which includes robot movements. If S is a partial schedule of length L, then S+w or Sw is a partial schedule of length L+1 and S(L+1)=w. Similarly, if length of S is L and S(L)=w, then S−w has length L−1 (in short, + means append a letter and − means remove a letter).

Finally, a commitment to data organization (structure) is necessary in an efficiently designed routine. Keep in mind that the number of chambers (and thus the number of successors of a given word) is relatively small. Thus, it does not make any difference if the routine generates all successors of a given letter and stores them, as opposed to dynamically generating the successors one-by-one as the need arises.

A basic schedule generator routine can be summarized by the following five steps:

1. Initialize the schedule: S←$\bar{O}$ and L←1 and go to Step 2.
2. $\bar{x}$←S(L) and δ←cnt($\bar{x}$). Store δ successors of $\bar{x}$, $\bar{y}_1$, $\bar{y}_2$, ..., $\bar{y}_6$, and mark them unused. Go to Step 3.
3. S←S+$\bar{y}_1$ and L←L+1 and δ←δ−1. Mark $\bar{y}_1$ used and go to Step 4.
4. Compare S(L) with S(1), S(2),...,S(L−1), respectively. If S(i)=S(L) for some i<1, print S and L and go to Step 5; else, go to Step 2.
5. S←S−S(L) and L←L−1. If L=1, STOP; else, go to Step 6.
6. If δ=0, go to Step 5. Else (δ>0), append an unused successor of S(L) to S, mark it used, δ←δ−1, and go to Step 2.

In step 1, the routine initializes the schedule, S, and the level of the search tree, L. Clearly, L must be initialized to 1. As for the initial letter in schedule S, for convenience, the routine uses a letter that has only one successor. A letter $\bar{O}$ corresponds to a situation in which all chambers are empty (i.e., the tool has just begun processing wafers).

In step 2, the routine first finds the number of successors, δ, of the last letter, say $\bar{x}$, in a partial schedule S(clearly, $\bar{x}$=S(1)). Function cnt($\bar{x}$) returns the number of successors of a given letter $\bar{x}$. Then, by using the rules which determine the successor of a given letter, the routine finds, stores and marks unused successors of $\bar{x}$. As a result, a successor may be a record with two fields: the first field is the actual letter, while the second field is a Boolean variable with value true if the successor was not used in a particular partial schedule S and value false otherwise. (Or the routine may use a matrix representation for the list of successors as described in Sections C and D above.)

In step 3, one of the unused successors of the last letter $\bar{x}$ is appended to the partial schedule S, the length of schedule L is increased by 1 and the number of unused successors of $\bar{x}$ is decreased by 1. (There will always be at least one successor to any given letter.)

In step 4, the routine checks if S is a full schedule by comparing the newly added (the last) letter S(L) with all previous letters S(1), S(2), . . . , S(L−1). (That should be accomplished every time a new letter is appended to a partial schedule.) If S(L) is a repeated letter, the routine prints (stores) the schedule; else, the routine continues with building the schedule.

When a partial schedule becomes a full schedule, S(1)) S(2)) . . . S(L), after storing the schedule, the routine removes the last letter S(L) and look for some other unused successor of S(L−1). If there are some unused successors, the routine appends a successor to the partial schedule, finds its successors, appends one of these successors and so on. If there are no successors, the routine removes S(L−1) from S and looks for unused successors of S(L−2) and so on. The program terminates when L=1 and δ=0 (meaning there are no unused successors of the first letter).

The routine above is valid for any representation of the scheduling problem. That is, either serial or mixed traces with letters from $\{0,1\}^n$ or either of these traces with robot position being part of the model (and thus alphabet from $\{0,1\}^n \times \{0,1 \ldots , n\}$). Clearly, functions that count and generate successors of a given letter are different each time.

Figure 10:
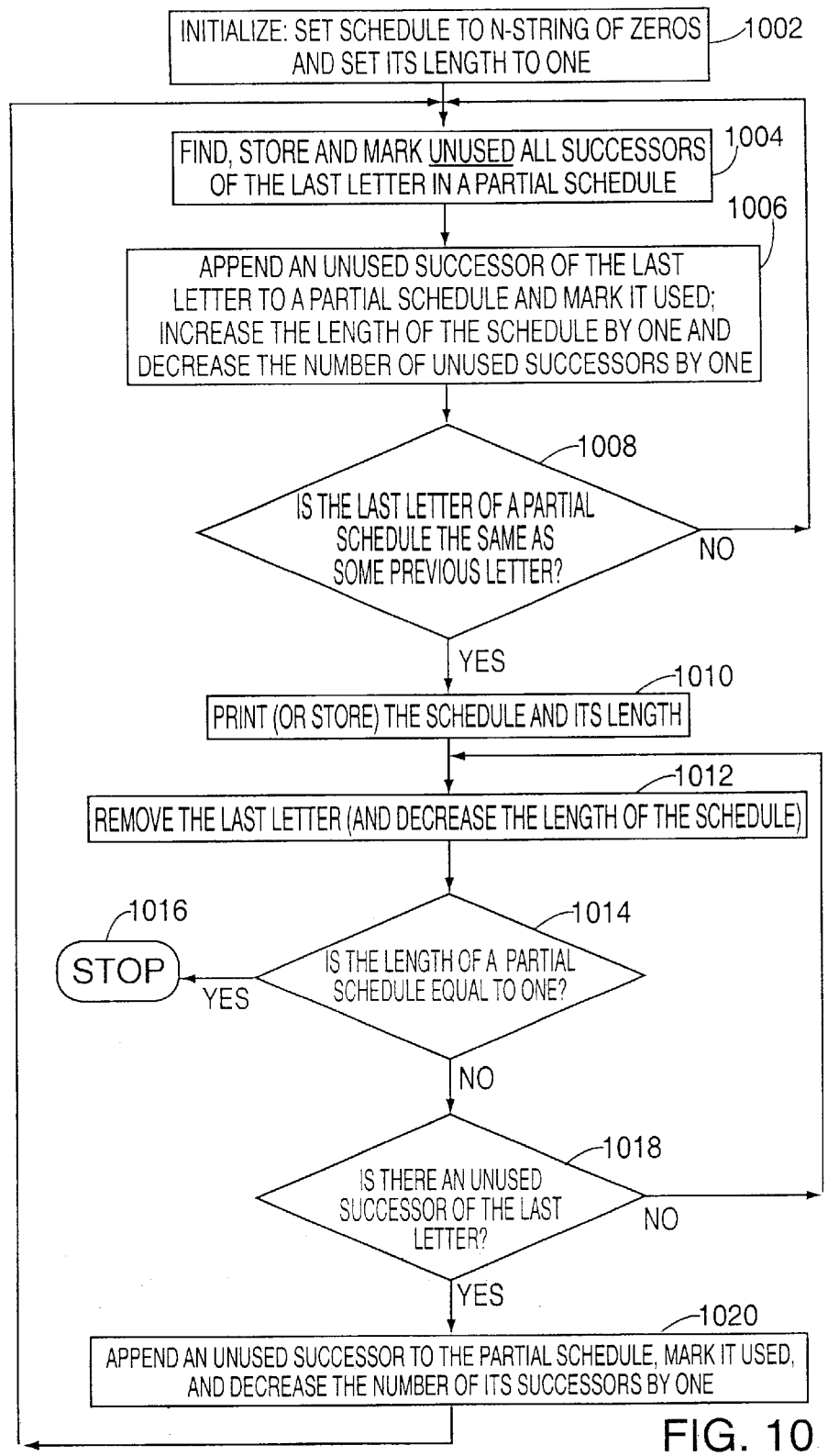
FIG. 10 depicts a flow diagram of a routine for producing all possible schedules for a given trace using a backtracking technique.

FIG. 10 depicts a flow diagram of a schedule generation routine 1000 that operates as generally discussed above. The routine 1000 begins at step 1002 by initializing the schedule, e.g., setting an initial letter to an n-tuple (n-string) of zeros. At step 1004, the routine finds, stores and marks all unused successors of the last letter in a partial schedule. The successor letters are determined using the pseudo-code routines SerGenerator, ParGenerator and MixGenerator and the number of successor letters for each letter is determined using SerCount, ParCount and MixCount. Of course, as mentioned above, if the robot position is to be taken into account, these pseudo-code routines must be appropriately modified to accommodate the expanded letters and the modify rules of successor generation.

Then, at step 1006, the routine appends an unused successor of the last letter to a partial schedule as well as increases the length of the schedule by one and decreases the number of unused successors by one. The routine queries, at step 1008, whether the last letter of the partial trace has been reached. If the query is negatively answered, the routine proceeds along the NO path to step 1004. If the query is affirmatively answered, the routine proceeds to step 1010 where the schedule is either printed or stored.

Steps 1012, 1014, 1016 and 1018 represent a backtracking process. At step 1012, the routine removes the last letter of the schedule to produce a partial schedule and reduce the schedule length by one. Then, at step 1014, the routine queries whether the length of schedule is one. If the query is affirmatively answered, the routine stops at step 1016. However, if the query is negatively answered, the routine proceeds to step 1018. At step 1018, the routine queries whether there is an unused successor to the last letter. If the query is negatively answered, the routine proceeds along the NO path to step 1012. Otherwise, the routine proceeds to step 1020 where an unused successor is appended to the partial schedule. The routine then returns to step 1004.

Once all possible schedules are determined and stored in memory, the schedules are processed by a conventional throughput model. Specifically, each schedule is used by the model to predict a throughput for that schedule. The throughputs for all the schedules are compared to find the schedule having the highest (best) throughput. The schedule with the highest throughput is deemed optimal and is used to control the sequencer. The throughput model may be executed upon the sequencer computer or, more likely, it is executed on a remote computer, and the optimal schedule is downloaded to the sequencer.

E. Schedule Generation Using Digraphs

In another embodiment of the invention, the schedule generation process is performed using digraphs that represent a plurality of schedules that are available for a particular cluster tool configuration. As stated above, if there are n chambers in the system, denoted by $C_1, C_2, \ldots , C_n$, then the invention uses a vector $\bar{u} \in \{0,1\}^n$ to describe the state-occupancy of the wafer processing system (cluster tool). That is, if there is a wafer in chamber $C_k$, then $\bar{u}_k=1$, else (chamber empty) the invention sets $\bar{u}_k=0$. This schedule is defined as a finite string of binary n-tuples, $$\bar{x} \ldots \bar{uv} \ldots ,$$

which starts and ends with the same binary n-tuple and this is the only repeated n-tuple. Any two consecutive n-tuples $\bar{u}$ and $\bar{v}$ in the schedule, $\bar{v}$ being a successor of $\bar{u}$ and denoted by $\bar{u}=s(\bar{u})$, will differ in at most two coordinates.

The length of a schedule is the number of different binary vectors comprising it. For example, $\bar{x}\bar{a}_1\bar{a}_2\bar{a}_3\bar{x}$ is a schedule of length four, if $\bar{a}_1=s(\bar{x})$ and $\bar{a}_{j+1}=s(\bar{a}_j)$ for j=1,2, and $\bar{x}=s(\bar{a}_3)$.

The following disclosure, for example, considers two set of rules (cases) in choosing a successor occupancy vector. The examples correspond to a serial and a mixed wafer flow, respectively. Parallel flows need not be considered since their optimum scheduling algorithm is well-known.

1) Serial Wafer Flow

In a serial wafer flow, $s=\{s_1,s_2,s_3\}$ and the successor occupancy-vector $\bar{v}=s(\bar{u})$ is chosen according to the following three rules:

$s_1$) If $\bar{u}[1]=0$, then $\bar{v}[1]=1$. For all k=2,3, . . . n, $\bar{v}[k]=\bar{u}[k]$.

$s_2$) If $\bar{u}[n]=1$, then $\bar{v}[n]0$. For all k=1,2, . . . n−1, $\bar{v}[k]=\bar{u}[k]$.

$s_3$) If $\bar{u}[i]=1$ and $\bar{u}[i+1]=0$, then $\bar{v}[i]=0$ and $\bar{v}[i+1]=1$. For all $\bar{k} \notin \{i,i+1\}$, $\bar{v}[k]=\bar{u}[k]$.

For example, according to the above rules s[(001)]={(101), (000)} and s[(010)]={(110), (001)} for a serial 3-chamber wafer flow. It is easy to see that number of successors of any given state cannot exceed [(n+1)/2] for a serial n-chamber wafer flow. For example, vector (0101) has three successors, namely (1101) and (0100) and (0011). They are obtained by applying $s_1$ and $s_2$ and $s_3$, respectively. The above rules $s_1,s_2,s_3$ correspond to a wafer being moved from a load-lock into the first chamber $C_1$, from the last chamber $C_n$ into the load-lock, and from the chamber $C_i$ into the successor chamber $C_{i+1}$, respectively.

In graph theoretic terms, the above formulation is even simpler. With n>1, let $G_n(V,E)$ be the directed graph (herein referred to as a digraph) with vertex set $V=\{0,1\}^n$ and edge set E given as follows:

with $\bar{u}=(u_1,u_2,\ldots,u_n)$ and $\bar{v}=(v_1,v_2,\ldots,v_n)$, $$(\bar{u},\bar{v}) \in E \Leftrightarrow \begin{cases} u_1=0, v_1=1, & u_i=v_i \ (i\neq 1), \\ u_n=1, v_n=0, & u_i=v_i \ (i\neq n), \\ (u_k,u_{k+1})=(1,0), & \text{for some } k \in [1,n), \\ (v_k,v_{k+1})=(0,1), & u_i=v_i \ (i\neq k, k+1). \end{cases}$$

Figure 11:
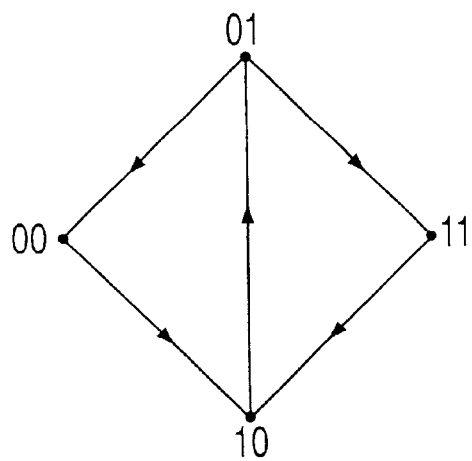
FIG. 11 depicts a chamber occupancy digraph associated with a two chamber serial wafer flow.
Figure 11A:
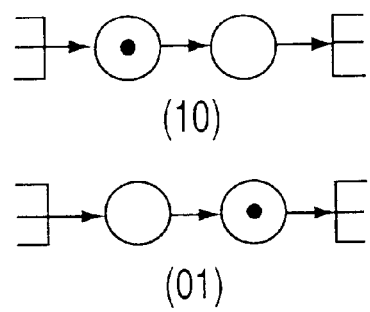
FIG. 11A illustrates wafer positions in a 2-chamber cluster tool associated with the digraph of FIG. 11.
Figure 12:
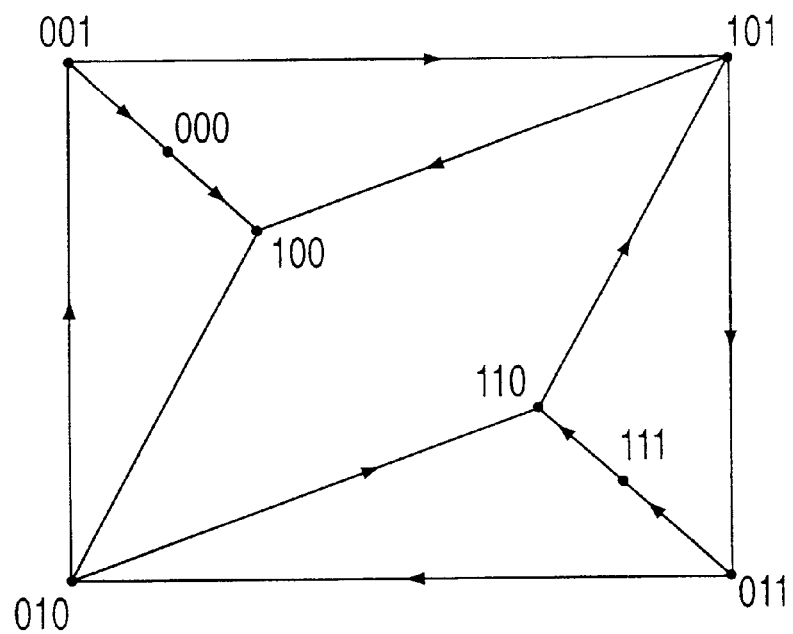
FIG. 12 depicts a chamber occupancy digraph associated with a three chamber serial wafer flow.
Figure 12A:
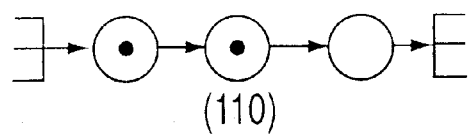
FIG. 12A illustrates wafer positioning in a 3-chamber cluster tool associated with the digraph of FIG. 12.
Figure 13:
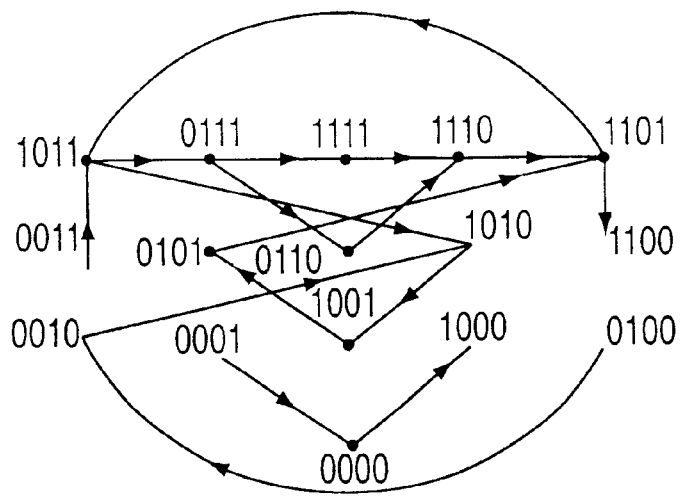
FIG. 13 depicts a chamber occupancy digraph associated with a four chamber serial wafer flow.
Figure 13A:
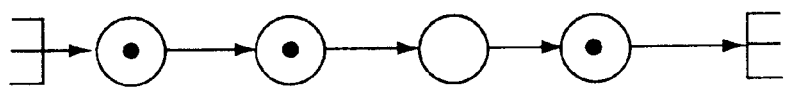
FIG. 13A illustrates wafer positioning in a 4-chamber cluster tool associated with the digraph of FIG. 13.

Diagrams of $G_2$, $G_3$ and $G_4$ are shown in FIGS. 11,12 and 13, respectively. FIGS. 11A, 12A, and 13A illustrate wafer positioning within the cluster tool, where an empty circle represents an empty chamber and a circle containing a dot represents a chamber containing a wafer. Let $f(n)=\Sigma_C l(C)$, where the sum is over all cycles in $G_n(V,E)$ and $l(C)$ denotes the length of a cycle C. Direct enumeration (by an algorithm to be discussed in detail below) gives $f(2)=6$, $f(3)=24$, $f(4)=180$, $f(5)=29,112$, and $j(6)=1,025,039,736$.

A schedule is then a finite string $\bar{x} \ldots \bar{uv} \ldots \bar{x}$ corresponding to a cycle in $G_n(V,E)$ that starts and ends at $\bar{x}$. Hence, f(n) is the total number of schedules. If $\bar{v}$ is the immediate successor of $\bar{u}$ in the schedule, then $\bar{u}$ and $\bar{v}$ differ in at most two coordinates, and v must be chosen according to the above rules $(s_1,s_2,s_3)$. These rules give rise to the requirements for $(\bar{u},\bar{v})\in E(G_n)$.

A digraph $G_n(V,E)$ defined above has the property that the length of each cycle in it is a multiple of n+1 where n is the number of stages. To see this, assign to each vertex $\bar{u}$ a corresponding weight $w(\bar{u})=\Sigma_k k u_k$. From the above description of $G_n(V,E)$, if $(\bar{uu},\bar{v})$ is any edge of $G_n(V,E)$, then either 1) $w(\bar{v})-w(\bar{u})=1$, or
2) $w(\bar{v})-w(\bar{u})=-n$.

Suppose there is a cycle of length r. If this cycle contains k edges $(\bar{u},\bar{v})$ where (2) above holds, then $(r-k)\times 1+(-n)\times k=0$, and hence $r=k\times(n+1)$.

Distribution of cycle lengths in $G_n(V,E)$ is not known. For example, all cycles in $G_2(V,E)$ have length three, all cycles in $G_3(V,E)$ have length four, and in $G_4(V,E)$ there are 24 cycles of length five and six cycles of length ten. The estimate for the length of the longest cycle in $G_n(V,E)$ is not known either. At present, even the estimates or bounds for f(n) seem to be out of reach.

2) Mixed Wafer Flow

Without loss of generality, in a mixed wafer example, it is assumed that an n-chamber mixed wafer flow is comprised of k successive stages (or families), $F_1, F_2, \ldots, F_k$, where $k\leq n$. If $1,2,\ldots,n$ are positions in a binary n-tuple $\bar{x}$ that correspond to chambers $C_1, C_2, \ldots, C_n$, respectively, then make positions $1,2,\ldots,|F_1|$ correspond to chambers in stage (family) 1, positions $|F_1|+1, |F_1|+2, \ldots, |F_1|+|F_2|$ correspond to chambers in stage (family) 2, and so on. If chamber $C_i$ belongs to stage (family) $F_t$, then the position i in the associated binary n-tuple $\bar{x}$ belongs to $F_t$ and write $i\in F_t$ (while, in fact, i is one of the $|F_t|$ consecutive positions in $\bar{x}$).

In this mixed flow example, $s=\{m_1,m_2,m_3\}$ and the successor occupancy vector $\bar{v}=s(\bar{u})$ is chosen according to the following rules:

$m_1$) If for some $i\in F_1$ and $\bar{u}[i]=0$, then $\bar{v}[i]=1$. For all $k\neq i$, $\bar{v}[k]=\bar{u}[k]$.

$m_2$) If for some $i\in F_k$ $\bar{u}[i]=1$, then $\bar{v}[i]=0$. For all $j\neq i$, $\bar{v}[j]=\bar{u}[j]$.

$m_3$) If for some $i\in F_t$ and for some $j\in F_{t+1}$ $\bar{u}[i]=1$ and $\bar{u}[j]=0$, then $\bar{v}[i]=0$ and $\bar{v}[j]=1$. For all $r\notin\{i,j\}$, $\bar{v}[r]=\bar{u}[r]$.

For example, if $|F_1|=2$ and $|F_2|=1$, then $s[(001)]=\{(101) (000), (011)\}$ and $s[(100)]=s[(010)]=\{(110), (001)\}$, which is quite different than the case $|F_t|=1$ for $t=1,2,3$. The above rules $\{m_1,m_2,m_3\}$ correspond to a wafer being moved from load-lock into the stage (family) 1, from the last stage (family) $F_k$ into the load-lock, and from the stage (family) $F_t$ into the next stage (family) $F_{t+1}$, respectively. Clearly, if $|F_t|=1$ for all $t=1,2,\ldots,k$, then $\{m_1,m_2,m_3\}_{=\{s1\}} ,s_2,s_3\}$.

For mixed wafer flows, the two smallest possible configurations (two chambers in the first stage-and one in the second stage and vice versa) have been examined. Their associated digraphs are shown in FIGS. 14 and 15 and FIGS. 14A and 15A illustrate wafer positions within the cluster tools. The set of all schedules can be divided into equivalence classes under a "cyclic shift" operation. A class is comprised of a schedule Q and all schedules derived from Q by applying the successor occupancy vector rules $m_1,m_2$ and $m_3$ so that all letters are on the same simple cycle of the associated digraph. By inspection, from FIGS. 14 and 15, it can be seen that for the smallest 2-stage mixed wafer flow schedules are either of length three or six.

As already mentioned, once the simple cycles are listed, the invention tests each cycle for throughput by using a throughput simulator. The cycle yielding maximum throughput is then deemed the optimum schedule. The importance of schedules found by the above method is that one cannot do better by scheduling wafers any other way. This conclusion can be formalized in the following statement:

The optimum schedule produced by evaluation of simple cycles is globally optimal, i.e., there is no cycle in the associated digraph $G(\{0,1\}^n,E)$ yielding smaller throughput than the optimum simple cycle.

To prove the above statement, note that as wafers are being moved through the cluster tool, the digraph $G(\{0,1\}^n,E)$, is being traversed (from a vertex $\bar{x}$ to one of the vertices in $s(\bar{x})$ to one of the vertices in $s(\bar{y})$, where $\bar{y}\in s(\bar{x})$, and so on). Hence, given a sufficient number of wafers, there will be a vertex in $G(\{0,1\}^n,E)$ which is visited twice. (This is because the number of vertices in $G(\{0,1\}^n,E)$ is $2^n$, where n is the number of chambers.) Any such cycle is a union of simple cycles and thus its corresponding throughput is the sum of throughputs of the simple cycles. It then follows from the fact that the sum of any M non-negative numbers (throughputs) is larger than M times the smallest number (throughput).

F. Schedule Determination Using Digraphs

As discussed above, the problem of finding an optimum schedule calls for finding all simple cycles in $G(\{0,1\}^n,E)$ whose vertices are occupancy-vectors from $\{0,1\}^n$ and whose edges are defined by either $\{s_1,s_2,s_3\}$ or by $\{m_1,m_2,m_3\}$ rules. That is, for any pair of vertices $\bar{x},\bar{y}\in\{0,1\}^n$ there is an edge from $\bar{x}$ to $\bar{y}$ if and only if $\bar{y}\in s(\bar{x})$. The schedules then correspond to simple cycles in $G(\{0,1\}^n,E)$.

The number of cycles in a digraph can be exponential in the number of vertices. For example, it is known that the complete digraph of n vertices and (n-1) edges contains $$\binom{n}{i}(i-1)!$$

cycles of length $i$ for a total of $$\sum_{i=2}^{n} \binom{n}{i}(i-1)! > (n-1)!$$

cycles.

Figures 16, 18:
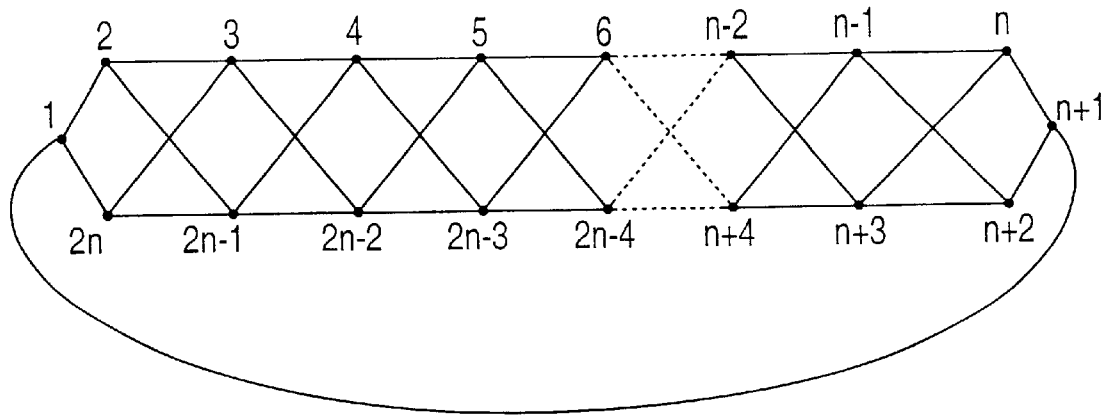
FIG. 16 depicts a digraph having an exponential number of simple cycles.
FIG. 18 depicts an adjacency matrix for the digraph of FIG. 11.

Another example of a digraph with exponential number of simple cycles is given in FIG. 16. In this case, however, the number of edges is substantially smaller than in case of a complete digraph. Thus, one can hardly expect an algorithm to be polynomial in the size of the input (here, the input has size $2^n$ where n is the number of stages). However, algorithms can be produced that generate the cycles in time $O((|V|+|E|)(c+1))$, where c is the number of cycles in the digraph. Such an algorithm would be very good, since the time taken just to print the cycles must be $L \cdot c$, where L is the average cycle length, which is upper bounded by number of vertices, i.e., $L = O(|V|)$. These cycles can be enumerated in several ways as discussed below.

a) Recursive Enumeration

Figure 17:
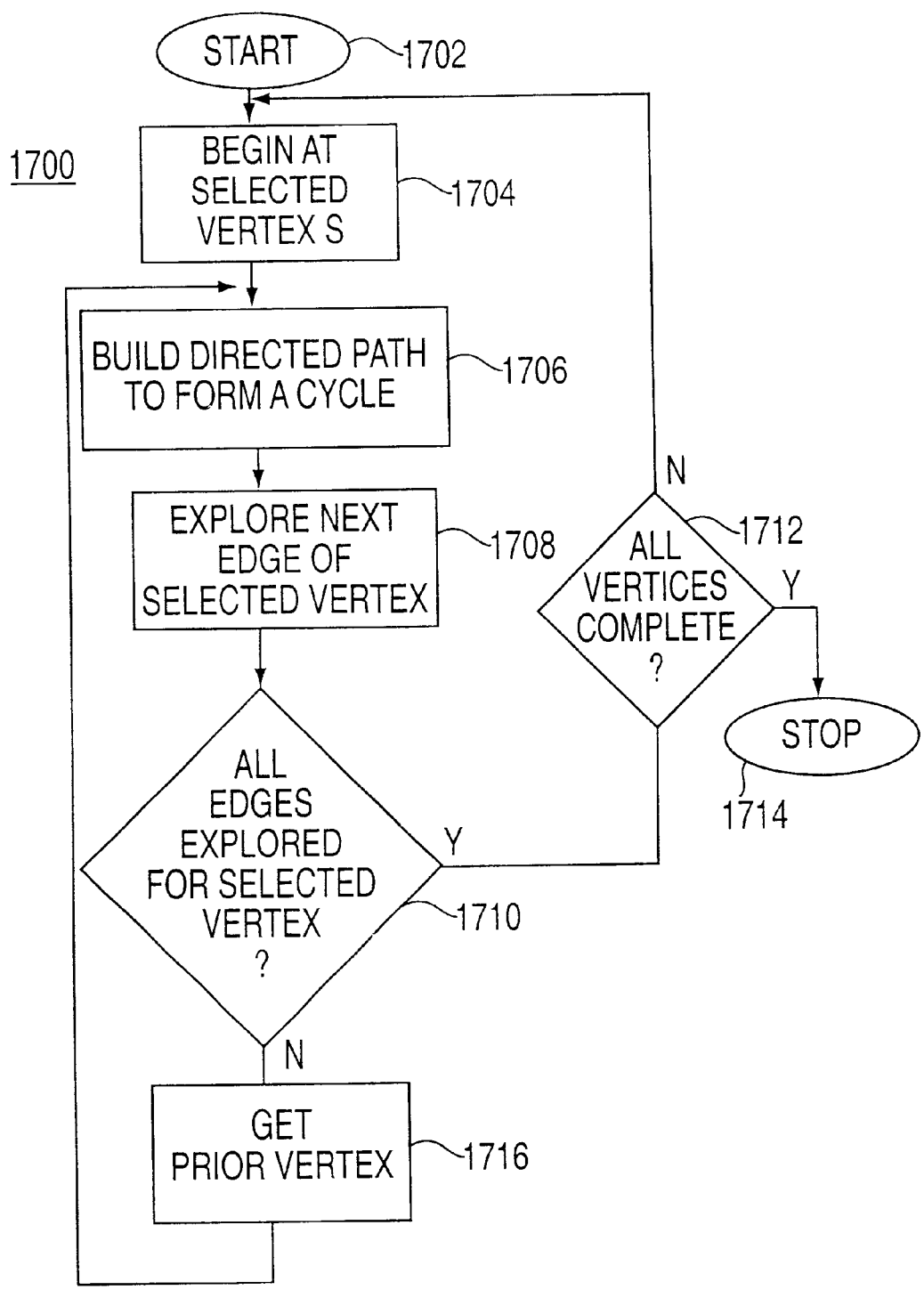
FIG. 17 depicts a flow diagram of a recursive enumeration process of the present invention.

In order to ensure that each generated cycle is new, vertices are assumed to be represented as integers from 1 to $|V|=2^n$, and each cycle is assumed to be rooted at the cycle's smallest vertex. FIG. 17 depicts a flow diagram of a recursive enumeration process 1700. The process begins at step 102 and proceeds to step 1704. At step 1704, a search begins at vertex s by building a directed path $(s,v_1,v_2\ldots,v_k)$ at step 1706, such that $v_i > s$ for $1 \leq i \leq k$. A cycle is identified (and stored) only when the next vertex $v_{k+1}=s$ is identified. After generating the cycle $(s,v_1,v_2,\ldots,v_k,s)$, the next edge extending from $v_k$ is explored at step 1708. If all edges going out of $v_k$ have been explored, the process 1700 proceeds through query 1710 to the previous vertex $v_{k-1}$ at step 1716 and attempts to list cycles from that vertex and so on. This process is continued through step 1710 until the process 1700 backs up past the starting vertex s; all cycles containing vertex s have then been generated. The process is repeated for every vertex $s=1,2,\ldots,|V|$ (i.e., until query 1712 is affirmatively answered). The process stops at step 1714.

To prevent traversing cycles that originate at a vertex $v_i$ during the search for cycles rooted at s, the process 1700 must exclude all vertices on the current path (except s) as extensions of that path. A vertex v will be marked as unavailable by setting avail(v) to false as soon as v is appended to the current path. The vertex v will remain unavailable at least until the process 1700 has backed up past v to the previous vertex on the current path. If the current path up to vertex v did not lead to a cycle rooted at s, v will remain unavailable for awhile even after the process backs up past it. This prevents searching for cycles in parts of the digraph on which such searches have been previously unsuccessful.

As the search progresses, the vertices on the current path are stored in a stack called path: a vertex v is added to the top of the stack before the search continues (by a recursive call) and is removed from the top of the stack in backing up (on return from the recursive call). The vertex is marked unavailable as the vertex is put on the stack and, if the vertex leads to a cycle rooted at s, made available again after the vertex is removed from the stack. If the process did not lead to a cycle rooted at s, then the cycle remains temporarily unavailable. A record is kept of the predecessors of all unavailable vertices that are not on the current path by maintaining sets B(w) for each $w \in V$:

B(w):={$v \in V | (v,w) \in E$ and v is unavailable and not on the current path}

In other words, B(w) is the set of unavailable predecessors of $w \in V$. When the current path is $(s,v_1,v_2,\ldots,v_k)$ and the next edge traversed is $(v_k,v_{k+1})$, there are three cases to consider:

1. If $v_{k+1}=s$, a new cycle $(s,v_1,v_2,\ldots,v_k,s)$ has been generated. The process outputs (e.g., print) the cycle and then set flag←true to indicate that a cycle (rooted at s) going through $v_k$ has been found.

2. If $v_{k+1} \neq s$ and $v_{k+1}$ is available, the process appends $v_{k+1}$ to the current path by making a recursive call to the cycle generating procedure.

3. If $v_{k+1}$ is unavailable, then the process ignores the cycle and looks for another edge starting at $v_k$. If there are no unexplored edges starting at $v_k$, $v_k$ is deleted from the path and the process backs up to $v_{k-1}$. In backing up to $v_{k-1}$, the process makes $v_k$ available again if it led to a cycle (i.e., if flag is true). Otherwise, the cycle is left unavailable and the vertices w that are successors of $v_k$ have $v_k$ added to their set B(w).

b) Digraph Generation Based On A Depth-First Search

In the case of generating a digraph using a depth-first search, a back edge of a digraph generated in a depth-first search corresponds to a simple cycle. A forward edge may correspond to a "short-cut" of a cycle. A cross edge (in the same tree) may correspond to one or more other simple cycles.

For example, in $\{0,1\}^2 = \{(00),(01),(10),(11)\}$ and serial wafer flow, edges are specified by the successor relationship as s[(00)]={(10)}
s[(01)]={(11), (00)}
s[(10)]={(00)}
s[(11)]={(0)}

Thus, the set E in $G(\{0,1\}^2, E)$ has five edges, namely ((00), (10)), ((01), (11)), ((01), (00)), ((10), (01)) and ((11), (10)), as shown in FIG. 11. There are only two distinct simple cycles of length three in the associated digraph. Since each k-cycle corresponds to k schedules, a 2-chamber serial wafer flow has six schedules.

The adjacency matrix shown in FIG. 18 that is associated with the digraph of FIG. 11 is a 4 by 4 binary matrix D such that $D(x,y)=1$ if and only if $y \in s(x)$. There is, of course, a one-to-one correspondence between these two objects, i.e., given the adjacency matrix D it is possible to recover digraph $G(\{0,1\}^2, E)$ within the isomorphism.

The adjacency matrix D for a two chamber serial wafer flow is given below. Note that, for example, $D((01),(11))=1$ because vertix (state) (11) is in the set s(01).

| Adjacency Matrix D | | | | |
|---|---|---|---|---|
| | 00 | 01 | 10 | 11 |
| 00 | 0 | 0 | 1 | 0 |
| 01 | 1 | 0 | 0 | 1 |
| 10 | 0 | 1 | 0 | 0 |
| 11 | 0 | 0 | 1 | 0 |

By using matrices $D^k$ for $k=2,3,\ldots$ it is easy to recognize paths or cycles of length k. For example, from the matrix $D^3$ below,

| Matrix $D^3$ | | | | |
|---|---|---|---|---|
| | 00 | 01 | 10 | 11 |
| 00 | 1 | 0 | 0 | 1 |
| 01 | 0 | 2 | 0 | 0 |
| 10 | 0 | 0 | 2 | 0 |
| 11 | 1 | 0 | 0 | 1 | it is easy to see that associated digraph has two cycles of length three (vertices) (01) and (10) below to both cycles while vertices (00) and (11) are on only one cycle). The real advantage of this association is for large digraphs which have many cycles.

Digraph Generation Using A Backtrack Search

To find all cycles in a given digraph, the invention may use a simple backtrack search. Let $\bar{u}_1$ be the starting vertex of a cycle. By using the rules for adding a successor vertix of a process builds a path, say $S=\bar{u}_1\bar{u}_2 \ldots \bar{u}_k$. There are two questions the process must answer every time it appends a new vertex $\bar{u}_{k+1}$ to path S:

a) Is $\bar{u}_1\bar{u}_2 \ldots \bar{u}_k\bar{u}_{k+1}$ a cycle;

b) If $\bar{u}_1\bar{u}_2 \ldots \bar{u}_k\bar{u}_{k+1}$ is a cycle, are there other cycles which have not been recorded.

Figure 19:
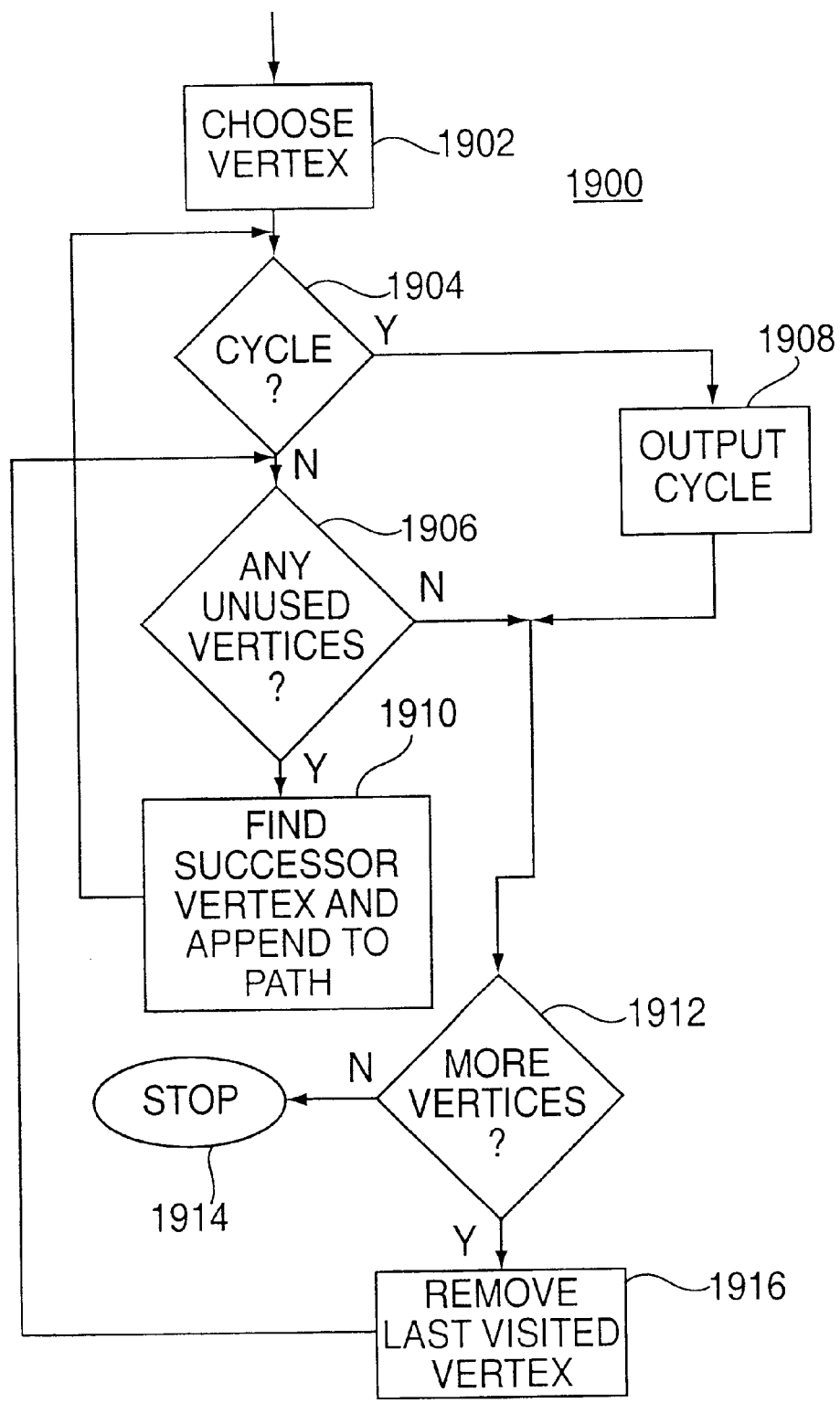
FIG. 19 depicts a flow diagram of a backtrack process for identifying successor vertices to produce a digraph.

A string $\bar{u}_1\bar{u}_2 \ldots \bar{u}_k\bar{u}_{k+1}$ is a cycle if it is built according to rules for successor occupancy-vector, all vertices $\bar{u}_1\bar{u}_2 \ldots \bar{u}_{k+1}$ are different, and the successor of $\bar{u}_{k+1}$ is the starting vertex $\bar{u}_1$. If $\bar{u}_1\bar{u}_{k+2} \ldots \bar{u}_k\bar{u}_{k+1}$ happens to be a simple-cycle, the process stores the cycle (or print it), removes the vertex $\bar{u}_{k+1}$ from the cycle and looks at some other unused successor of $\bar{u}_k$. If there is such a successor, say $\bar{z}$, the process checks if $\bar{u}_1\bar{u}_2 \ldots \bar{u}_k\bar{z}$ a cycle. If $\bar{u}_1\bar{u}_2 \ldots \bar{u}_k\bar{z}$ is not a cycle, the process appends an unused successor of $\bar{z}$ and so on. If $\bar{u}_1\bar{u}_2 \ldots \bar{u}_k\bar{z}$ is a cycle, the process removes $\bar{z}$ and look for another unused successor of $\bar{u}_k$. If there are no unused successors of $\bar{u}_k$, the process returns (backtracks) and looks at unused successors of $\bar{u}_{k-1}$ and so on until the process returns to the starting vertex $\bar{u}_1$. FIG. 19 depicts a flow diagram of the backtrack process 1900. The process performs the following sequence of steps:

Step 1902. (Initialize.) Choose the first vertex $\bar{u}_1$ of a cycle and go to Step 1904.

Step 1904. If $\bar{u}_1\bar{u}_2 \ldots \bar{u}_k$ is not a cycle, go to Step 1906. Else, go to Step 1908.

Step 1906. Find a successor vertex (of the last vertex $\bar{u}_k$ in the cycle) which was not used, go to step 1908. If there are no unused successors, go to Step 1912.

Step 1908. Append the vertex to the path and go to Step 1904.

Step 1908. Output (print or store) the cycle and go to Step 1912.

Step 1912. If there are no more vertices, then STOP at step 1914. Else, go to Step 1916.

Step 1916. (Backtrack.) Remove the last visited vertex from the cycle and go to Step 1906.

Clearly, the process 1900 must ensure that the process doesn't produce duplicate cycles in Step 1908 as well as that the process have produced all possible cycles. The former is performed in Step 19010 where the process appends only an unused successor of the last vertex to the path. The latter is ensured by the proper termination condition (i.e., the process is at $\bar{u}_1$ and there are no unused successors of $\bar{u}_1$). To find all schedules, the process needs to the backtrack search for each vertex from $\{0,1\}^n$. If $\alpha(\bar{x})$ is the number of cycles that start with the vertex $\bar{x}$, the total number of cycles is $\Sigma_{\bar{x}\in\{0,1\}_n}\alpha(\bar{x})$.

G. Chamber Clean

Figure 20:
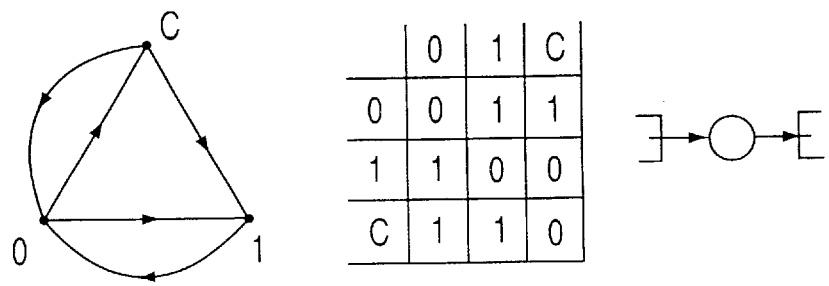
FIG. 20 depicts a chamber occupancy digraph and adjacency matrix for a chamber with a cleaning process.

When chamber cleaning process is taken into account in the schedule generation process, a chamber has three states: 0 (empty chamber), 1 (wafer in chamber), and C (chamber undergoing a cleaning process). Only an empty chamber can initiate a cleaning process. When a cleaning process is over, a chamber either remains empty or a wafer is put in. FIG. 20 depicts digraph $G_1(\{0,1,C\},E)$ that takes account of cleaning processes. FIG. 20 also depicts the digraph's corresponding adjacency matrix and an illustrative wafer positioning.

Figure 21:
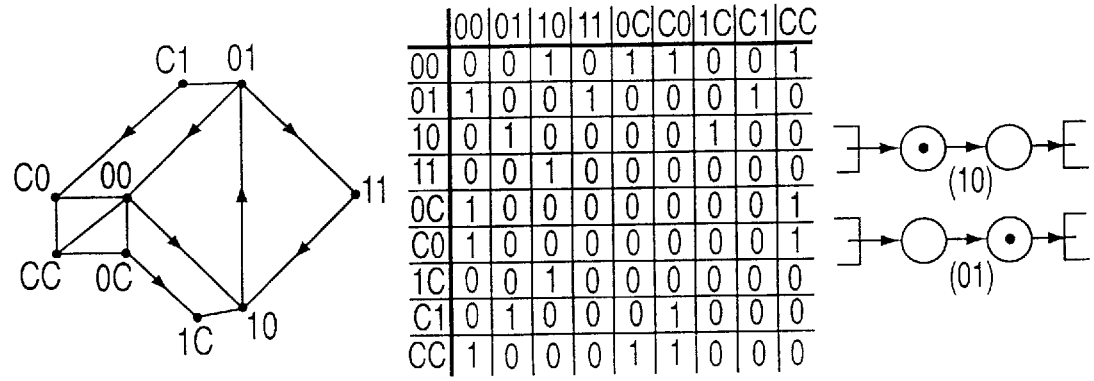
FIG. 21 depicts a chamber occupancy digraph and adjacency matrix for a two chamber wafer flow with a cleaning process.

Due to a chamber cleaning process, the number of states increases considerably and is given by $3^n$ where n is the number of stages. This is illustrated in FIG. 21 depicting a digraph, an adjacency matrix and illustrative wafer positioning in a cluster tool for a 2-chamber serial wafer flow with chamber clean. In the associated 9-vertex digraph, there are now seven cycles of length two, 4 cycles of length three, two cycles of length five, three cycles of length six, one cycle of length seven and one of length eight.

When a chamber cleaning process happens frequently (e.g. clean after processing every wafer), one must deal with the extended $3^n$-node digraph that accounts for "chamber-clean" state. The procedure however remains the same as described above. The process is only longer because the number of simple-cycles is bigger. When a chamber clean is infrequent, one can ignore the cleaning process and use the schedule obtained for 2-state chamber occupancy modified for the chamber clean. That is, every time a chamber clean happens, the cycle starts from a new vertex and is optimum until the next clean happens.

The present invention rapidly computes all possible schedules for a given cluster tool configuration. The schedules are then executed by a throughput model to determine the optimal schedule. As such, the present invention facilitates automatic determination of an optimal schedule in a rapid and accurate manner that has heretofore been unavailable in the prior art.

Although various embodiments which incorporate the teachings of the present invention have been shown and described in detail herein, those skilled in the art can readily devise many of the varied embodiments that still incorporate these teachings.

What is claimed is:

1. A method of producing schedules for processing a wafer in a multichamber semiconductor wafer processing tool comprising the steps of:
   (a) providing a trace defining a series of chambers that are visited by a wafer as the wafer is processed by the tool;
   (b) initializing a sequence generator with an initial digraph vertex defining an initial wafer positioning with the tool; and
   (c) generating vectors that represent all valid wafer movements related to the initial digraph vertex that lead to valid successor vertices, where said vectors and vertices, taken together, form a digraph that represents at least one schedule for processing a wafer.

2. The method of claim 1 wherein combinations of vertices and vectors form cycles in the digraph, where each cycle represents a schedule.

3. The method of claim 1 further comprising the steps of:
   (d) backtracking through a set of vertices and applying step (c) to a prior vertex to produce further successor vertices and vectors; and
   (e) stopping said backtracking when all possible cycles are produced that represent all possible valid schedules.

4. The method of claim 3 further comprising the step of:
   (f) identifying at least one schedule in all possible valid schedules that provides an optimal throughput for a given trace.

5. The method of claim 4 wherein said identifying step (f) further comprises the step of computing the throughput for each and every schedule of said all possible schedules and selecting an optimum schedule for the trace which produces the highest throughput.

6. The method of claim 3 wherein said backtracking step (d) further comprises the steps of:

(a') initializing a vertex;
(b') identifying an unused successor vertex;
(c') appending the unused successor vertex to a path;
(d') querying whether the last vertex is the same as a previous vertex in the path and, if not, repeat steps (b'), (c'), and (d') until the last vertex of the path is the same as some previous vertex in the path;
(e') storing the path as a cycle;
(f') querying whether any other cycles remain and, if not, stopping; otherwise, proceeding to step (g');
(g') removing the last vertex of the cycle;
(h') querying whether there is an unused successor vertex and, if there are no unused successor vertices, repeating steps (f'), (g') and (h') until there is an unused successor vertex;
(i') appending the unused successor vertex to a new path, marking the successor vertex as used; and
(k') returning to step (b').

7. The method of claim 6 wherein successor vertices are defined by successor generation rules that are prescribed by wafer processing parameters.

8. The method of claim 6 wherein successor vertices are generated with regard to transport-robot positioning.

9. Apparatus for producing schedules for processing a wafer in a multichamber semiconductor wafer processing tool, having a trace defining a series of chambers that are visited by a wafer as the wafer is processed by the tool, said apparatus comprising:
   a sequence generator, being initialized with an initial value of a vertex defining an initial wafer positioning within the tool, for generating values of said vertex that represent all valid successor wafer positions related to the initial vertex, where said vertices and vectors connecting the vertices, taken together, form at least one cycle that represents a schedule for processing a wafer.

10. The apparatus of claim 9 further comprising a throughput model, coupled to said sequence generator, for computing a throughput value for each possible schedule in said all possible schedules.

11. The apparatus of claim 10 further comprising means for identifying at least one schedule that has the largest throughput value.

12. Apparatus for producing schedules for processing a wafer in a multichamber semiconductor wafer processing tool, having a trace defining a series of chambers that are visited by a wafer as the wafer is processed by the tool, said apparatus comprising:
   (a) means for providing a trace defining a series of chambers that are visited by a wafer as the wafer is processed by the tool;
   (b) means for initializing a sequence generator with an initial digraph vertex defining an initial wafer positioning with the tool; and
   (c) means for generating vectors that represent all valid wafer movements related to the initial digraph vertex that lead to valid successor vertices, where said vectors and vertices, taken together, form a cycle that represents at least one schedule for processing a wafer.

13. The apparatus of claim 12 wherein combinations of vertices and vectors form cycles in the digraph, where each cycle represents a schedule.

14. The apparatus of claim 12 further comprising:
   (d) means for backtracking through a set of vertices and applying said means for generating vectors to a prior vertex to produce further successor vertices and vectors; and
   (e) means for stopping said backtracking when all possible cycles are produced that represent all possible valid schedules.

15. A computer readable memory containing software that, when executed by a processor, causes a sequence generator to perform a method of producing schedules for processing a wafer in a multichamber semiconductor wafer processing tool comprising the steps of:
   (a) providing a trace defining a series of chambers that are visited by a wafer as the wafer is processed by the tool;
   (b) initializing a sequence generator with an initial digraph vertex defining an initial wafer positioning with the tool; and
   (c) generating vectors that represent all valid wafer movements related to the initial digraph vertex that lead to valid successor vertices, where said vectors and vertices, taken together, form a digraph that represents at least one schedule for processing a wafer.

16. The method of claim 15 wherein combinations of vertices and vectors form cycles in the digraph, where each cycle represents a schedule.

17. The method of claim 15 further comprising the steps of:
   (d) backtracking through a set of vertices and applying step (c) to a prior vertex to produce further successor vertices and vectors; and
   (e) stopping said backtracking when all possible cycles are produced that represent all possible valid schedules.

18. The method of claim 17 further comprising the step of:
   (f) identifying at least one schedule in all possible valid schedules that provides an optimal throughput for a given trace.

19. The method of claim 18 wherein said identifying step (f) further comprises the step of computing the throughput for each and every schedule of said all possible schedules and selecting an optimum schedule for the trace which produces the highest throughput.

20. The method of claim 17 wherein said backtracking step (d) further comprises the steps of:
   (a') initializing a vertex;
   (b') identifying an unused successor vertex;
   (c') appending the unused successor vertex to a path;
   (d') querying whether the last vertex is the same as a previous vertex in the path and, if not, repeat steps (b'), (c'), and (d') until the last vertex of the path is the same as some previous vertex in the path;
   (e') storing the path as a cycle;
   (f') querying whether any other cycles remain and, if not, stopping; otherwise, proceeding to step (g');
   (g') removing the last vertex of the cycle;
   (h') querying whether there is an unused successor vertex and, if there are no unused successor vertices, repeating steps (f'), (g') and (h') until there is an unused successor vertex;
   (i') appending the unused successor vertex to a new path, marking the successor vertex as used; and
   (j') returning to step (b').

21. The method of claim 20 wherein successor vertices are defined by successor generation rules that are implied by a wafer processing sequence.

22. The method of claim 20 wherein successor vertices are generated with regard to transport-robot positioning.

* * * * *

UNITED STATES PATENT AND TRADEMARK OFFICE
CERTIFICATE OF CORRECTION

PATENT NO. : 6,725,114 B1
DATED : April 20, 2004
INVENTOR(S) : Dusan B Jevtic

It is certified that error appears in the above-identified patent and that said Letters Patent is hereby corrected as shown below:

Column 3,
Line 57, please change "$\bar{u} \in \{0,1\}^N$" to -- $\bar{v} \in \{0,1\}^N$ --.

Column 5,
Line 64, please change "$C_1, c_2,$" to -- $C_1, C_2$ --.

Column 6,
Line 37, please change "urtx," to -- rtx, --.

Column 9,
Line 27, please change "modifies $\bar{u}$" to -- modifies $\bar{v}$ --.

Line 42, please change "Generatin" to -- Generation --.

Column 13,
Line 28, please change "$\bar{u}_1 \bar{u}_{k+2} \ldots$" to -- $\bar{u}_1 \bar{u}_2$ --.

Column 14,
Line 11, please change 'word $\bar{O}\bar{e}_2$" to -- word $\bar{O}\bar{e}_1\bar{e}_2$ --.

Column 16,
Line 23, please change "$C_1, c_2, \ldots$" to -- $C_1, C_2, \ldots$ --.

Line 30, please change "$\bar{u}\, \bar{v} \ldots$" to -- $\bar{u}\, \bar{v} \ldots \vec{x}$ --.

Column 21,
Line 17, please change "$\ldots \bar{u}_k \bar{u}_{k+1}$" to -- $\ldots \bar{u}_k \bar{u}_{k+1} \bar{u}_1$ --.

UNITED STATES PATENT AND TRADEMARK OFFICE
CERTIFICATE OF CORRECTION

PATENT NO. : 6,725,114 B1
DATED : April 20, 2004
INVENTOR(S) : Dusan B Jevtic

It is certified that error appears in the above-identified patent and that said Letters Patent is hereby corrected as shown below:

Column 21, cont'd.,
Line 55, please change "$\Sigma \bar{x} \in \{0,1\}_n \alpha$" to -- $\Sigma \bar{x} \in \{0,1\}^n \alpha$ --.

Signed and Sealed this

Thirtieth Day of November, 2004

JON W. DUDAS
*Director of the United States Patent and Trademark Office*